(12) United States Patent
Park et al.

(10) Patent No.: US 9,081,043 B2
(45) Date of Patent: Jul. 14, 2015

(54) SYSTEM AND METHOD FOR CALCULATING POWER USING CONTACTLESS VOLTAGE WAVEFORM SHAPE SENSOR

(75) Inventors: Daniel J. Park, Beaverton, OR (US); James E. Owen, Vancouver, WA (US); David Elrod, Beaverton, OR (US)

(73) Assignee: Sharp Laboratories of America, Inc., Camas, WA (US)

(*) Notice: Subject to any disclaimer, the term of this patent is extended or adjusted under 35 U.S.C. 154(b) by 699 days.

(21) Appl. No.: 13/371,327

(22) Filed: Feb. 10, 2012

(65) Prior Publication Data

US 2013/0211751 A1    Aug. 15, 2013

(51) Int. Cl.
*G01R 21/00* (2006.01)
*G01R 21/06* (2006.01)

(52) U.S. Cl.
CPC ........................... *G01R 21/06* (2013.01)

(58) Field of Classification Search
CPC . G01R 21/06; G06F 17/5031; G06F 17/5036; G06F 2217/78; G06F 2217/84
See application file for complete search history.

(56) References Cited

U.S. PATENT DOCUMENTS

| | | | |
|---|---|---|---|
| 5,768,145 A * | 6/1998 | Roethig | ........................... 703/14 |
| 6,778,920 B1 | 8/2004 | Balch et al. | |
| 7,539,581 B2 | 5/2009 | Swarztrauber et al. | |
| 2011/0074382 A1* | 3/2011 | Patel | ........................... 324/76.11 |

OTHER PUBLICATIONS

Patel et al., "The Design and Evaluation of an End-User-Deployable, Whole House, Contactless Power Consumption Sensor", CHI 2010: Proceedings of ACM Conference on Human Factor.
Schmid et al., "Meter Any Wire, Anywhere by Virtualizing the Voltage Channel", BuildSys, Nov. 10, 2010.
Maciej A. Noras, "Solid state electric field sensor", Proc. ESA Annual Meeting on Electrostatics 2011.
Maciej A. Noras. "Electric field sensor based on a varactor diode/MIS/MOS structure" IEEE, Proceeding from Industry Applications Society Annual Meeting, 2010.
Hioki, User Guide to Safety, 3129 Series Phase detector.

* cited by examiner

*Primary Examiner* — Elias Desta
(74) *Attorney, Agent, or Firm* — Law Office of Gerald Maliszewski; Gerald Maliszewski

(57) ABSTRACT

A system and method are provided for calculating power using a voltage waveform shape measurement from a contactless sensor. An electrically conductive medium carries alternating current (AC) electrical current, associated with an AC voltage, from a source node to a destination node. AC current is measured through the electrically conductive medium. Using a contactless sensor, an AC voltage waveform shape is measured. The power usage at the destination node is calculated in response to the AC current measurement, the measurement of the AC voltage waveform shape, and an AC voltage potential. For simplicity, the AC current and AC voltage waveform shape may both be measured at a first node located between the source node and the destination node. The AC voltage potential used in the power usage calculation may be an estimate, an actual measurement, or a value supplied by an external source (e.g., the power utility).

24 Claims, 13 Drawing Sheets

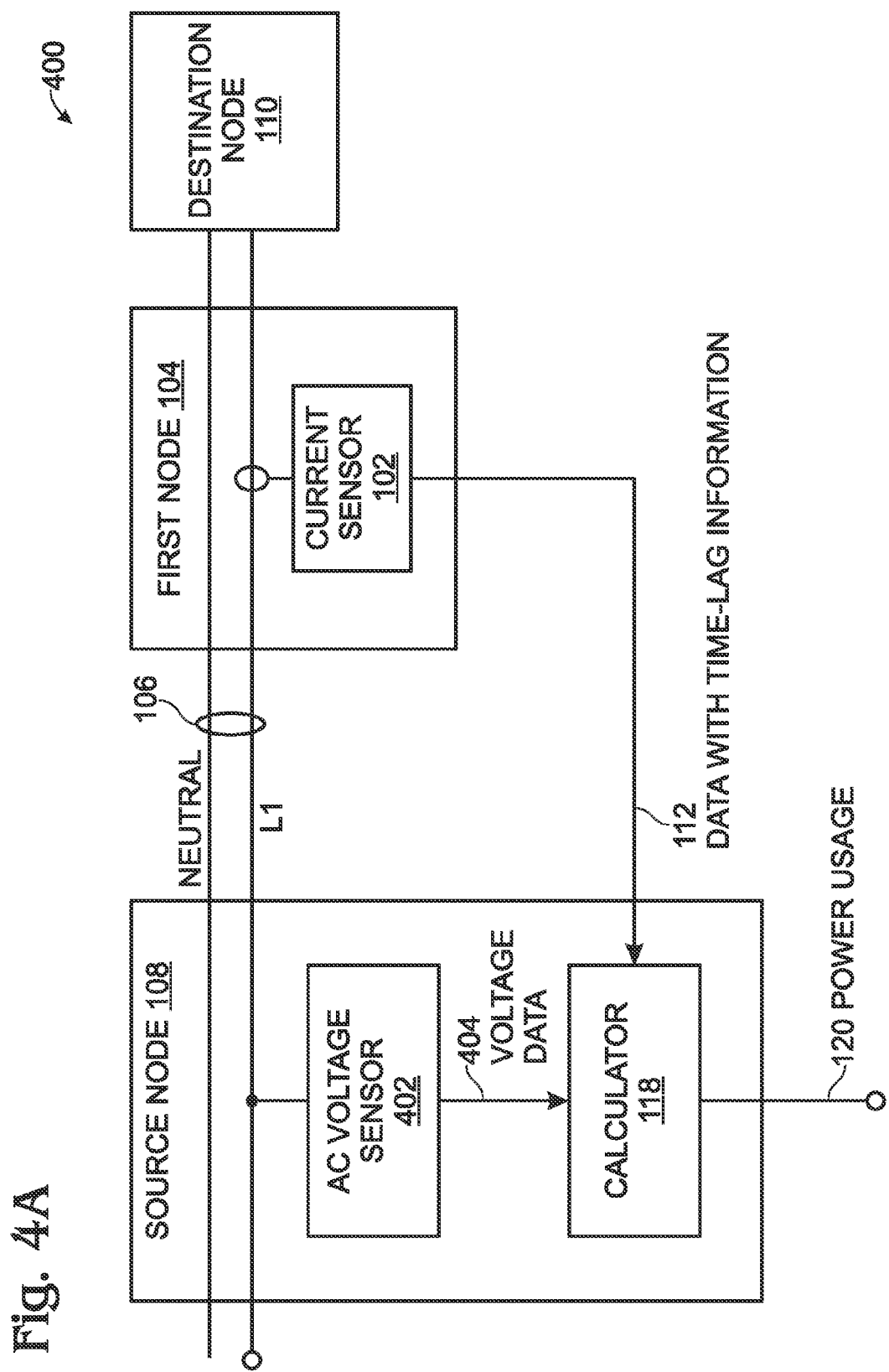

SYSTEM AND METHOD FOR CALCULATING POWER USING CONTACTLESS VOLTAGE WAVEFORM SHAPE SENSOR

BACKGROUND OF THE INVENTION

1. Field of the Invention

This invention generally relates to alternating current (AC) power measurement and, more particularly, to a system and method for measuring AC power with a contactless voltage waveform shape sensor.

2. Description of the Related Art

The electric energy used in a residence is commonly measured with electric meters that have full access to the electric power conductors feeding that residence. However, the electric meter is typically the property of the local electric utility and the measurements made are generally not available to the residence by automated means. In order for the resident to obtain electric consumption data in near real-time, an additional electric meter is often installed behind the utility's electric meter (at the resident's side). The installation of an additional electric meter generally requires access to the same electric conductors as the utility owned meter. The connections consist of two types: 1) a current sensor which is often made with a ferrite core transformer placed around each conductor and 2) a physical electrical connection to measure the voltage on each conductor.

Placement of the current sensors around the insulated conductors requires no modification to wiring. However, tapping the electrical conductors to make voltage measurements often requires physically accessing dangerously high voltage conductors. For safety reasons, the voltage measurement connections often require the installation of permanent attachment points which increases the cost of installation and the expertise required (often a licensed electrician).

FIG. 14 is a drawing depicting a multi-family metering system (prior art). In a multi-family installation, the number of conventional meters and electrical connections required scales with the number of residences metered. At each 240V split phase electric meter, the following is required:

a connection to neutral, L1, and L2
  current loops placed around L1 and L2

Thus, for 50 apartments, 150 connections and 100 current loops would be required. However, since the meters are all likely on one supply bus, L1, L2, and neutral connection (3 tap points) are needed at the feed bus and then the voltages are delivered to the meters (via an external voltage distribution wire network).

Conventionally, a voltmeter requires a contact connection, and it's bundled with the current sensor and put in the panel; thus requiring installation by an electrician. The power is computed from the current and voltage measurements. The power measurements are sent to a collector. The collector can show the measurements on a server or it can send them to a display for the user to view. Some new components described in the literature are non-contact voltage meters using inexpensive electronics. One example is a magnetometer plate for measuring current outside of the panel, and a calibration load used for scaling of the amperage detected by the magnetometer. A magnetometer is a device that measures the strength or direction of a magnetic field. In this case, the flow of current in the conductor induces a magnetic field which is picked up by the magnetometer.

Non-contact single node monitors, such as the ones advertised by Owl® monitor and the PowerSave EnviR, are easy to install because they do not need to be wired in. The drawback is that they need to be battery powered and they suffer inaccuracies because of the poor voltage estimates. The power calculation they use is: $I_{rms} \times V_{rms}$. Current transformers provide waveform, phase, and magnitude measurements, and a nominal $V_{rms}$ is estimated. Distortions result as a result of using the nominal $V_{rms}$, and from the failure to account for harmonic power factor, displacement power factor, and harmonic voltage.

FIG. 12 is a block diagram depicting a first power measurement system (prior art). Recent papers describe non-contact meters for single residences consisting of separate volt and current nodes. One paper (Patel et al., "The Design and Evaluation of an End-User-Deployable, Whole House, Contactless Power Consumption Sensor", CHI 2010: Proceedings of ACM Conference on Human Factors in Computing Systems, April 2010) describes a current shape sensor or magnetometer that is attached to the outside of the electric panel and calibrated. Placement of the sensor on the electric panel is crucial and is guided by 2 LED lights on the sensor. A calibrating unit cycles through a series of known loads (10 W, 100 W, and 200 W) that are pulsed at 1 Hz. This system suffers from the fact that it doesn't actively measure voltage, and instead relies on the one calibration (which has an assumed power factor of 1). This approach improves upon the commercial products that use current sensors as it does not require physical access to the conductors, but does not account for changes in power factor or any changes in voltage. One difference between Patel's system and existing commercial meters is the use of the calibrated magnetometer instead of a current transformer, either of which can be used for current sensing.

In summary, Patel discloses a single node system that performs a power calculation of: $I_{rms} \times V_{rms}$. The sensor is a magnetometer to determine current that must be calibrated, and a nominal $V_{rms}$ is estimated. Distortions in power measurements occur as a result of using the nominal $V_{rms}$, and the failure to account for harmonic power factor, displacement power factor, and harmonic voltage.

A single node system is also proposed by Nora (Maciej A. Noras, "Solid state electric field sensor", Proc. ESA Annual Meeting on Electrostatics 2011, and Maciej A. Noras. "Electric field sensor based on a varactor diode/MIS/MOS structure" IEEE, Proceeding from Industry Applications Society Annual Meeting, 2010). Noras' proposed single node monitor calculates power as: sum (I×V). The sensors are current transformers and electrostatic voltage meters. An electrostatic voltage meter determines the voltage of a conductor by measuring the electrostatic field generated by that voltage. The value of $V_{rms}$ is estimated. While the distortions in measurement are limited to the voltage estimate, the electrostatic voltage meter may consume too much power to be packaged as a self-powered (e.g., battery operated) node. This problem can only be ameliorated by measuring voltage sporadically.

FIG. 13 is a block diagram depicting a second power measurement system (prior art). Another paper (Schmid et al., "Meter Any Wire, Anywhere by Virtualizing the Voltage Channel", BuildSys, Nov. 10, 2010) describes synchronizing voltage phase and voltage values from the voltage-measuring node to the current node. Schmid describes virtualizing the voltage by implementing separate nodes (contact and non-contact). This allows a homeowner to install it by putting the non-contact node in the panel, and then plugging in the $V_{node}$ into any nearby wall socket. This synchronization requirement is similar to the synchrophasors on high voltage lines that send voltage and current samples with GPS synchronized timestamps. This system requires that the current node do all the computing, and it requires the node clocks to remain synchronized. While this approach improves significantly over Patel, the synchronization requires 2-way radios and fairly complex phase locked loops, which impact reliability, complexity, and cost.

It would be advantageous if a more accurate means of measuring power usage existed that used a contactless AC voltage sensor.

SUMMARY OF THE INVENTION

Disclosed herein are a system and method that permits third parties to inexpensively instrument single-family or multi-family buildings (with grouped or physically distant utility meters) to locally monitor electrical consumption. The system and method may also be used to conveniently monitor sub-circuits within the same residence or facility. The system installation requires no connections at the panel or an electrician.

An important issue in power metering is the need to measure current, voltage, and the phase difference between the two, thereby allowing power factor (PF) to accurately be assessed for each unit. The determination of PF aids in the accurate calculation of actual power consumption.

Conventionally, accurate power measurement requires the installation of individual third party meters on each metered circuit, which is prohibitive in terms of both equipment and installation costs. The third party meters require multiple connections to the electrical wiring, significant physical space for mounting, and a communications link to each device for gathering of the acquired measurements. Other conventional approaches calculate power by using non-contact current meters and the assumption of a fixed voltage. These non-contact meters often require synchronization and yield grossly inaccurate results.

Accordingly, a method is provided for calculating power using a voltage waveform shape measurement from a contactless sensor. An electrically conductive medium carries alternating current (AC) electrical current, associated with an AC voltage, from a source node to a destination node. The method measures the AC current through the electrically conductive medium. Using a contactless sensor not directly connected to the electrically conductive medium, an AC voltage waveform shape is measured. The power usage at the destination node is calculated in response to the AC current measurement, the measurement of the AC voltage waveform shape, and the AC voltage potential. For simplicity, the AC current and AC voltage waveform shape may both be measured at a first node located between the source node and the destination node. The AC voltage potential used in the power usage calculation may be an estimate, an actual measurement, or a value supplied by an external source (e.g., the power utility).

In one aspect, a plurality of instantaneous current values (I) are measured each AC cycle, and the AC voltage phase is determined from the AC voltage waveform shape. Then, power usage is determined by calculating AC current phase and an AC current root mean square ($I_{RMS}$) value from the plurality of I values. A difference angle ($\theta$) is found between the phase of the AC current and the phase of the AC voltage. Using a $V_{RMS}$ value derived from the AC voltage potential, $\cos(\theta) \times I_{RMS} \times V_{RMS}$ is found. In a variation, AC current phase is calculated from the plurality of I values. A synthesized AC voltage signal is calculated with a plurality of instantaneous voltage values (V) each cycle, by scaling an AC voltage magnitude by an estimate of the AC voltage waveform shape (e.g., a sine wave) having the same phase as the measured AC voltage waveform. A difference angle ($\theta$) is found between the phase of the AC current and the phase of the AC voltage.

The difference angle is used to maintain displacement between the I and V instantaneous values, and (I×V) is summed over a plurality of values. As another alternative, the synthesized AC voltage signal can be created by scaling an AC voltage magnitude by the measured AC voltage waveform shape.

Additional details of the above-described method and a system for calculating power using a contactless voltage phase sensor are provided below.

BRIEF DESCRIPTION OF THE DRAWINGS

FIGS. 4A through 4C are schematic diagrams depicting a system for calculating power using information measured at different nodes.

DETAILED DESCRIPTION

Figure 1:
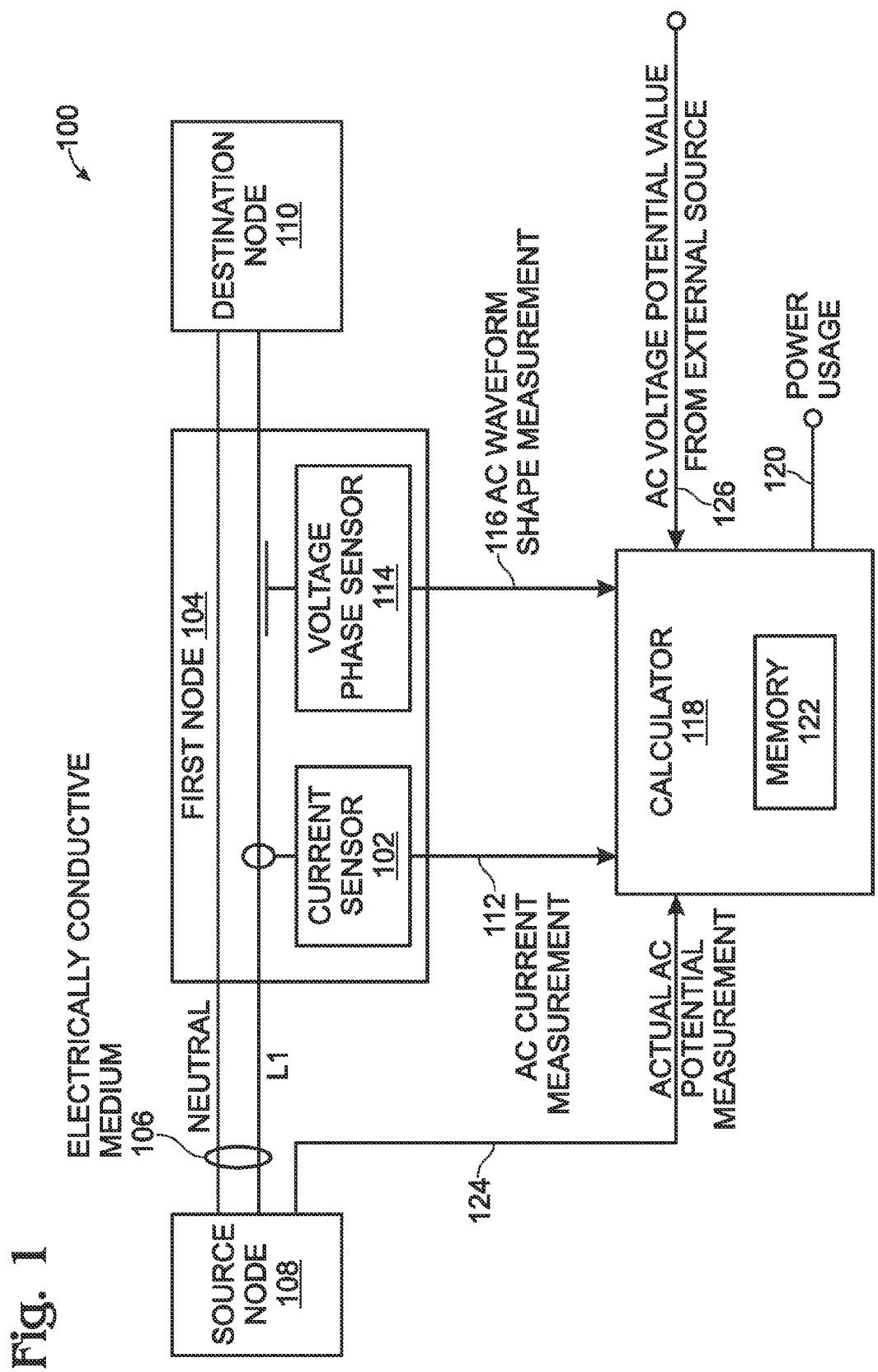
FIG. 1 is a schematic block diagram of a system for calculating power using a contactless voltage phase sensor.

FIG. 1 is a schematic block diagram of a system for calculating power using a contactless voltage phase sensor. The system 100 comprises a contactless alternating current (AC) current sensor 102 configured to couple to a first node 104 of an electrically conductive medium 106 carrying AC current, associated with an AC voltage. The first node 104 may be located at any point between the source node 108 and the destination node 110. The system 100 may be enabled using any conventional current sensor. For example, a sensor made with a ferrite core transformer measures inductance generated by current, and once calibrated, can yield a current measurement. Alternatively, the AC current sensor may be of the type that actually contacts the conductor. For example, a current meter connected in series may be used, but then the full current runs through the meter. It is more typical to put a shunt resistor in series and then measure the voltage drop across the shunt resister. This makes the measuring equipment more manageable. Also the shunt resistor is sized for the expected loads and then a standard voltmeter can be used to detect the current.

The electrically conductive medium 106 is connected from the source node 108 to the destination node 110. Typically, the electrically conductive medium is copper wires, with an AC voltage potential between wires L1 and L2 (not shown), and a neutral/ground. The contactless AC current sensor 102 has an output on line 112 for supplying an AC current measurement. A contactless voltage phase sensor 114 is configured to couple to the first node 104 without directly connecting to the electrically conductive medium 106. The voltage phase sensor 114 has an output on line 116 for supplying an AC waveform shape measurement. In one aspect, the voltage phase sensor is a flat plate, or a plate curved to at least partially surround the electrical conductive medium. It is not necessarily important where the single wire carrying the measurement signal connects to the plate 114. The plate picks up a charge from the conductor 106. That charge may then be applied to an A/D converter to make the measurements.

A calculator 118 has an input port on line 112 to accept the AC current measurement and an input port on line 116 to accept the AC waveform shape measurement. The calculator 118 has an output on line 120 to supply a power usage value for the destination node in response to the AC current measurement, the AC voltage waveform shape measurement, and an AC voltage potential. Here, the calculator is shown as a separate node in the system. Alternatively however, the calculator may be located at the first node, the source node, the destination node, or a node making an AC voltage potential measurement. The calculator 118 calculates the power usage in response to an AC voltage potential estimate (e.g., stored in memory 122), or an actual measurement of the AC voltage potential. As shown, the source node in this example supplies the measured AC voltage potential on line 124, however, the measurement may be made at other nodes in the system. The AC voltage potential may also be a value supplied by an external source on line 126 (e.g., from the power utility).

In one aspect, the AC current sensor 102 supplies a plurality of instantaneous current values (I) each AC cycle. The voltage phase sensor 114 supplies an AC voltage phase measurement. For example, the voltage axis zero crossings of the voltage waveform shape, and the interval between zero crossings, can be used to yield the voltage phase. The calculator 118 calculates AC current phase and an AC current root mean square ($I_{RMS}$) value from the plurality of I values, and finds a difference angle (θ) between the phase of the AC current and the phase of the AC voltage. The calculator uses a $V_{RMS}$ value derived from the AC voltage potential to find cos (θ)×$I_{RMS}$× $V_{RMS}$. As noted above, the AC voltage potential may be an estimate, and actual measured value, or a value supplied by an external source. The phase value θ may be adjusted by a fix value set to compensate for a known phase offset.

In a related variation, the calculator 118 calculates AC current phase from the plurality of I values. The calculator 118 creates a synthesized AC voltage signal with a plurality of instantaneous voltage values (V) each cycle, by scaling an AC voltage magnitude (derived from the AC voltage potential) by an estimate of the AC voltage waveform shape having the same phase as the AC voltage phase measurement. In the simplest form the AC waveform may be estimated as a perfect sine wave, however, other waveform shape estimates are possible. The calculator 118 finds a difference angle (θ) between the phase of the AC current and the phase of the AC voltage, and uses the difference angle to maintain displacement between the I and V instantaneous values. Finally, the calculator sums (I×V) over a plurality of values. Although not explicitly shown, the AC current phase may alternatively be determined by the current sensor.

In another related variation, the calculator 118 calculates AC current phase from the plurality of I values and creates a synthesized AC voltage signal with a plurality of instantaneous voltage values (V) each cycle, by scaling an AC voltage magnitude by the measured AC voltage waveform shape. The calculator 118 finds a difference angle (θ) between the phase of the AC current and the phase of the AC voltage, uses the difference angle to maintain displacement between the I and V instantaneous values, and sums (I×V) over a plurality of values.

In another variation, the AC current sensor 102 supplies a plurality of instantaneous current values (I) each AC cycle. The calculator 118 accepts a plurality of measured instantaneous voltage values (V) each cycle from the external source on line 126. The calculator 118 calculates AC current phase in response to the plurality of I values, and finds a difference angle (θ) between the phase of the AC current and the phase of the AC voltage. The calculator 118 uses the difference angle to maintain displacement between the I and V instantaneous values, and sums (I×V) over a plurality of values.

Figure 2:
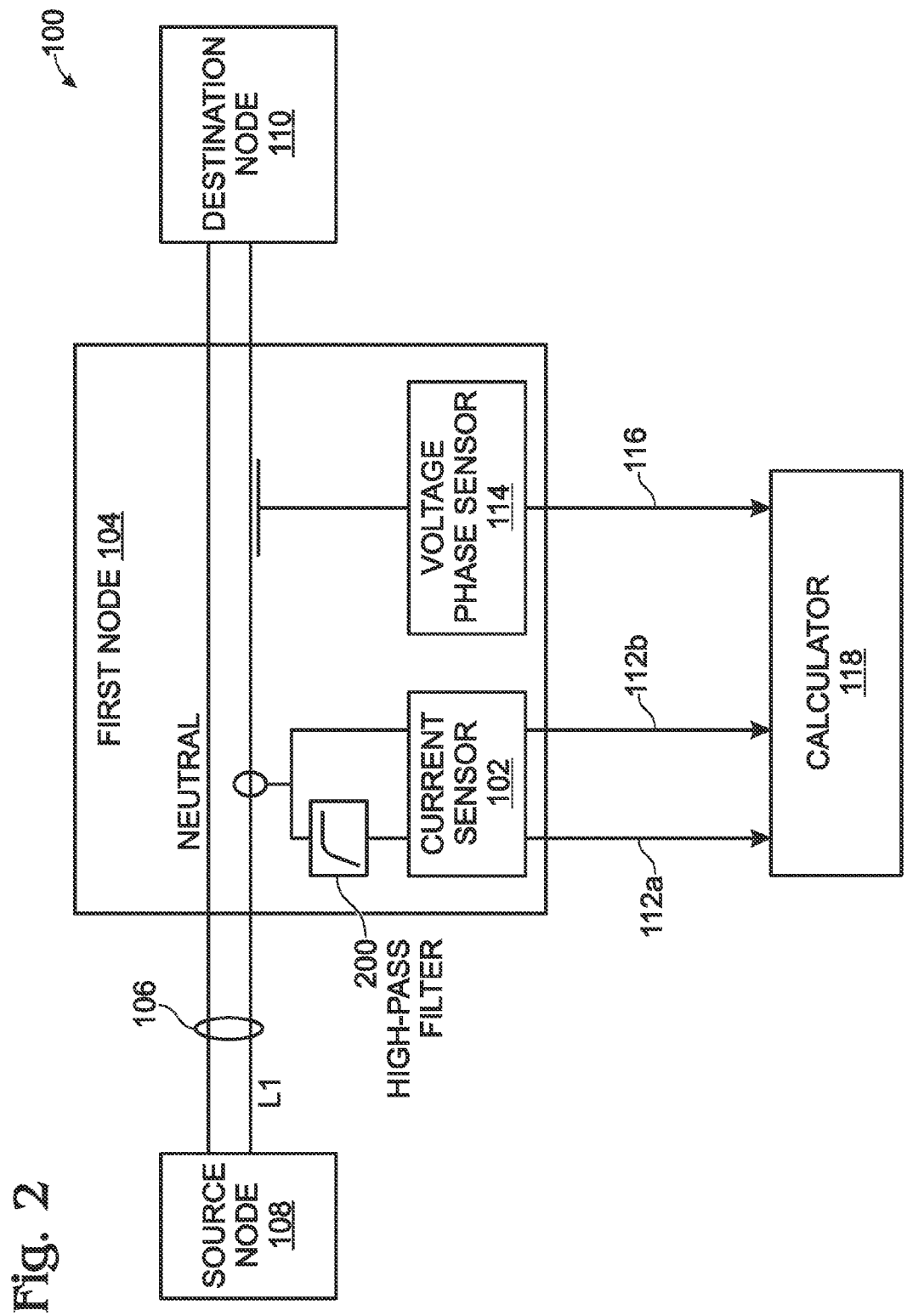
FIG. 2 is a schematic block diagram depicting a harmonic distortion power factor variation of the system of FIG. 1.

FIG. 2 is a schematic block diagram depicting a harmonic distortion power factor variation of the system of FIG. 1. In this aspect the AC current sensor 102 includes a high-pass filter 200 and supplies a plurality of instantaneous current values (I) each AC cycle on line 112a with a plurality of high-pass filtered I values on line 112b. The voltage phase sensor 114 supplies an AC voltage phase measurement. The calculator 118 calculates AC current phase from the plurality of I values and calculates a harmonic distortion power factor (hpf) from the I values and filtered I values. The calculator 118 finds a difference, angle (θ) between the phase of the AC current and the phase of the AC voltage, and uses a $V_{RMS}$ value derived from the AC voltage potential, to find cos (θ)×$I_{RMS}$× $V_{RMS}$×hpf.

Figure 3:
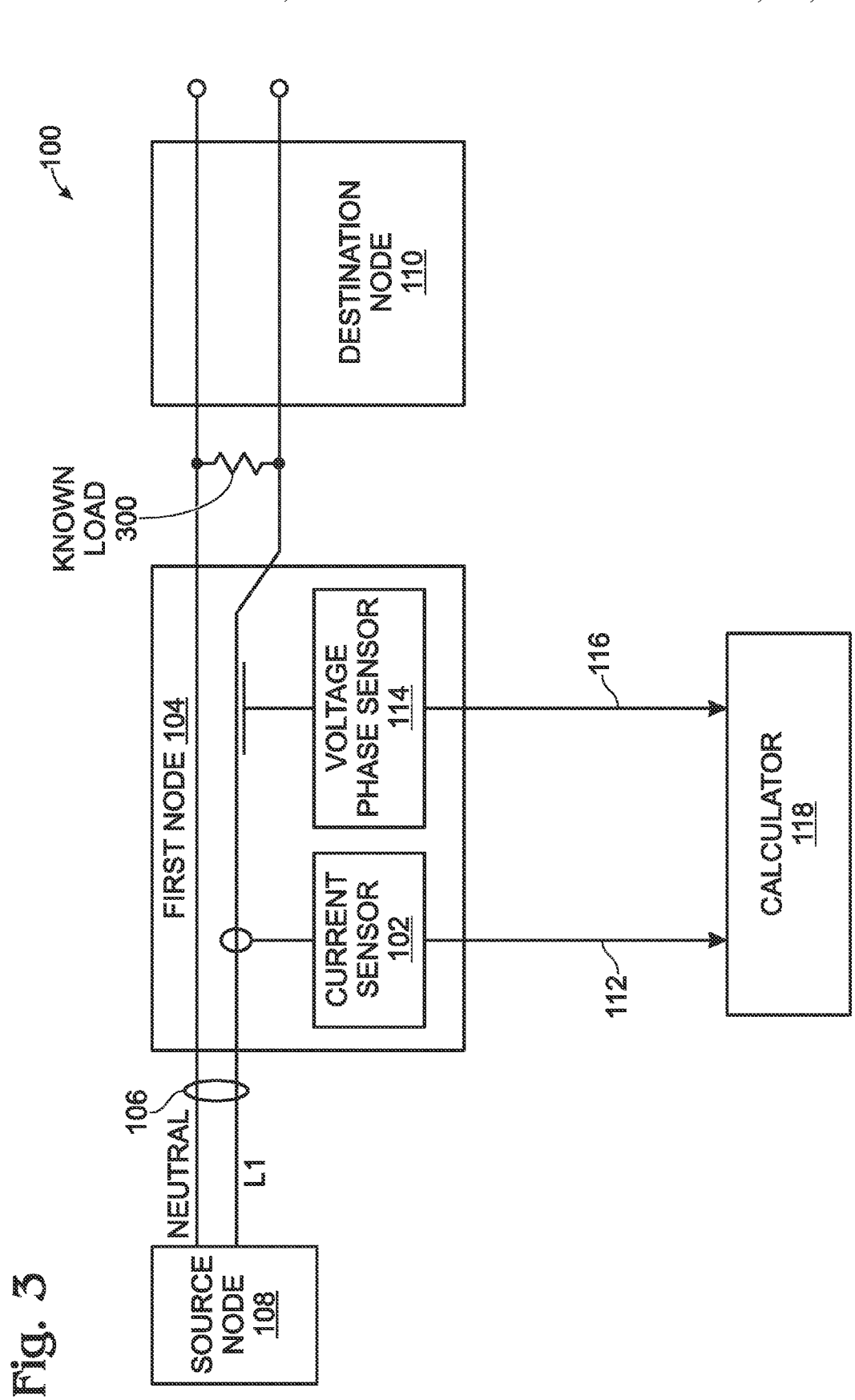
FIG. 3 is a schematic block diagram depicting a load calibration variation of the system of FIG. 1.

FIG. 3 is a schematic block diagram depicting a load calibration variation of the system of FIG. 1. A known load 300 is configured to selectively connect to (i.e. draw power from) a second node (as shown, the destination node 110 is the second node) of the electrically conductive medium 106. The AC current sensor 102 supplies a calibrated AC current measurement when the known load is connected. The calculator 118 is able to calculate a $V_{RMS}$ value in response to the known load and calibrated AC current measurement, and it uses the $V_{RMS}$ value as the AC voltage potential in calculating power usage. In one aspect, the known load 300 is selectively connected to the second node 110 for sub-cycle durations. The known load may be a resistor (or range of resistors), a capacitor (or range of capacitors), an inductor (or range of inductors), or a combination of the above-listed elements.

Figure 4B:
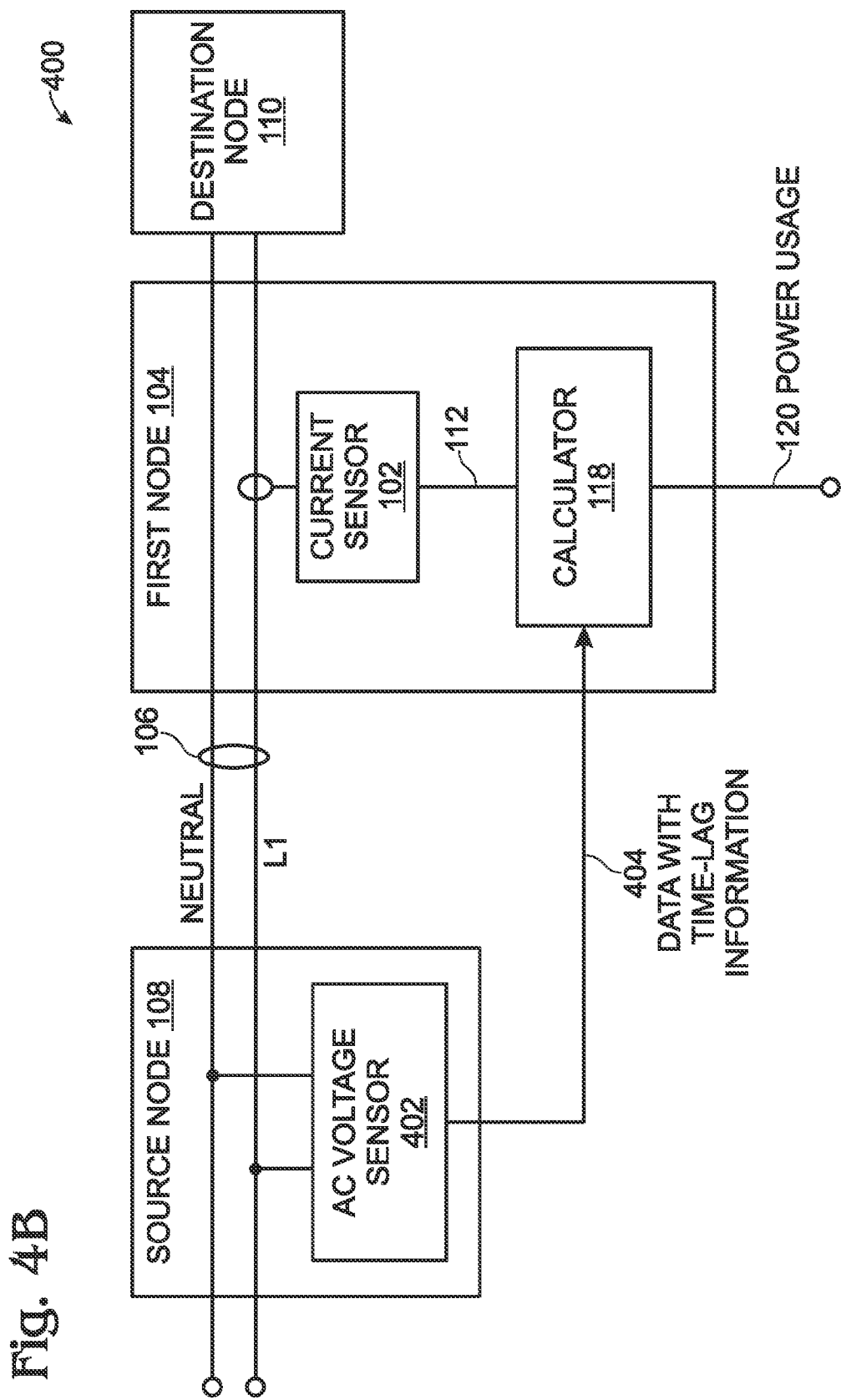
Figure 4C:
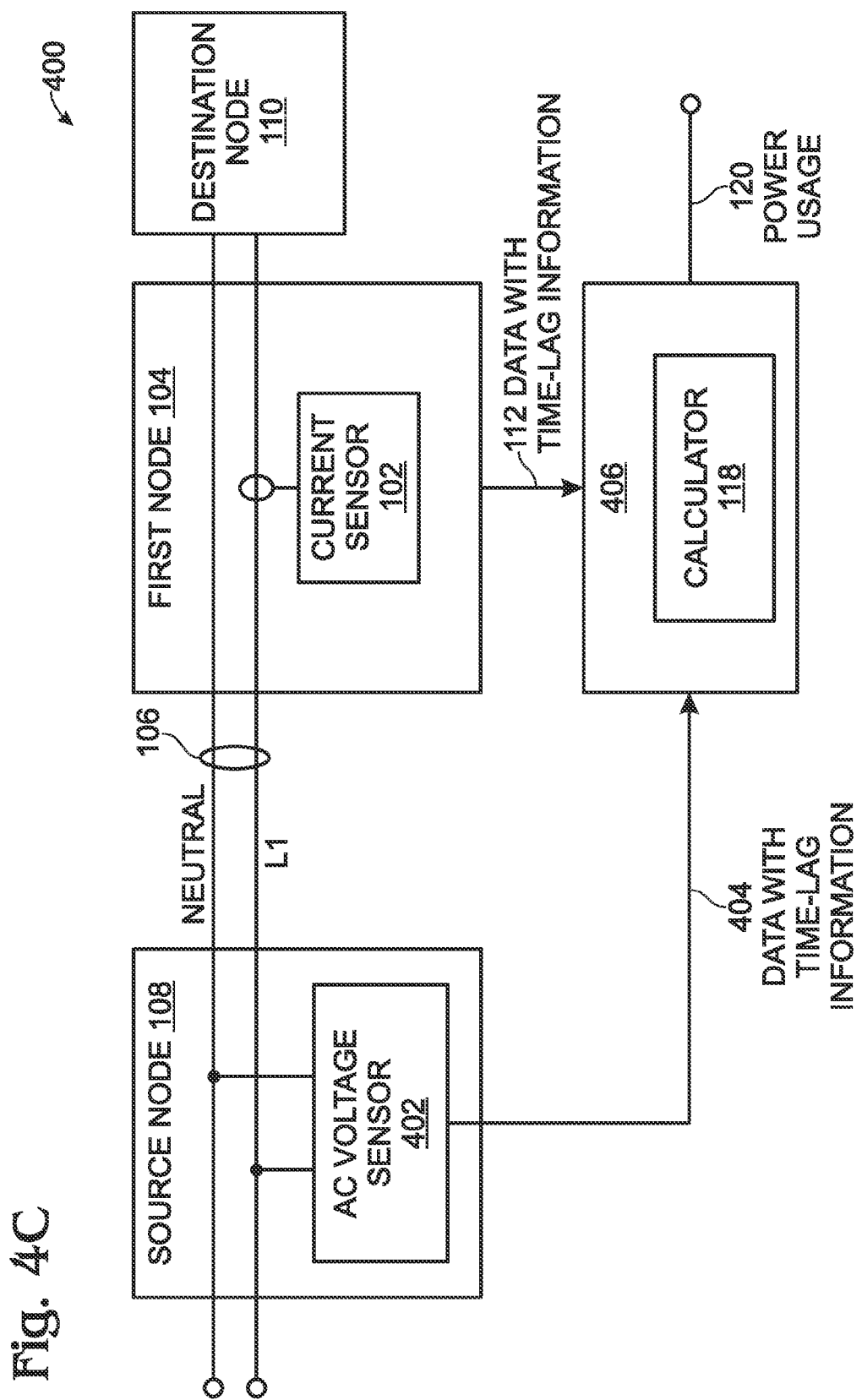

FIGS. 4A through 4C are schematic diagrams depicting a system for calculating power using information measured at different nodes. The system 400 comprises an alternating current (AC) current sensor 102 configured to couple to a first node 104 of an electrically conductive medium 106 carrying AC current, associated with an AC voltage. The electrically conductive medium carries current from a source node 108 to a destination node 110. The AC current sensor 102 has an output on line 112 for supplying AC current measurement data.

An AC voltage sensor 402 is configured to couple to a second node (shown here as the source node 108), and has an output on line 404 for supplying AC voltage measurement data. Note: the AC voltage sensor may alternately be located at the first node or destination node. Also note: in this aspect the AC current and AC voltage sensors may be contactless or of a type that make contact with the electrical conductor 106. A test node, which may be the first node 104, the second node 108, and both the first node 104 and second node 108, transmits measurement data including a measured time-lag value. The time-lag value is a duration of time between when data is measured, and when the data is transmitted. A calculator 118 has an input on line 112 to accept the AC current measurement data and an input on line 404 the AC voltage measurement data, with the time lag values. The calculator 118 has an output on line 120 to supply destination node power usage data in response to the inputs.

FIG. 4A depicts the test node being the first node 104, with the calculator being located at the second node. In other words, the AC current sensor 102 transmits current data to the calculator 118, with a time-lag value. FIG. 4B depicts the test node being the second node, with the calculator 118 being located at the first node. In this aspect the AC voltage sensor 402 transmits AC voltage data with a time-lag value. FIG. 4C depicts the AC current sensor 102 and AC voltage sensor 402 both acting as test nodes, with the calculator being located at a third node 406. That is, both the AC current sensor 102 and AC voltage sensor 402 send data with time-lag values. The importance of the time-lag values in deriving accurate power measurements is presented in more detail below.

Figure 5A:
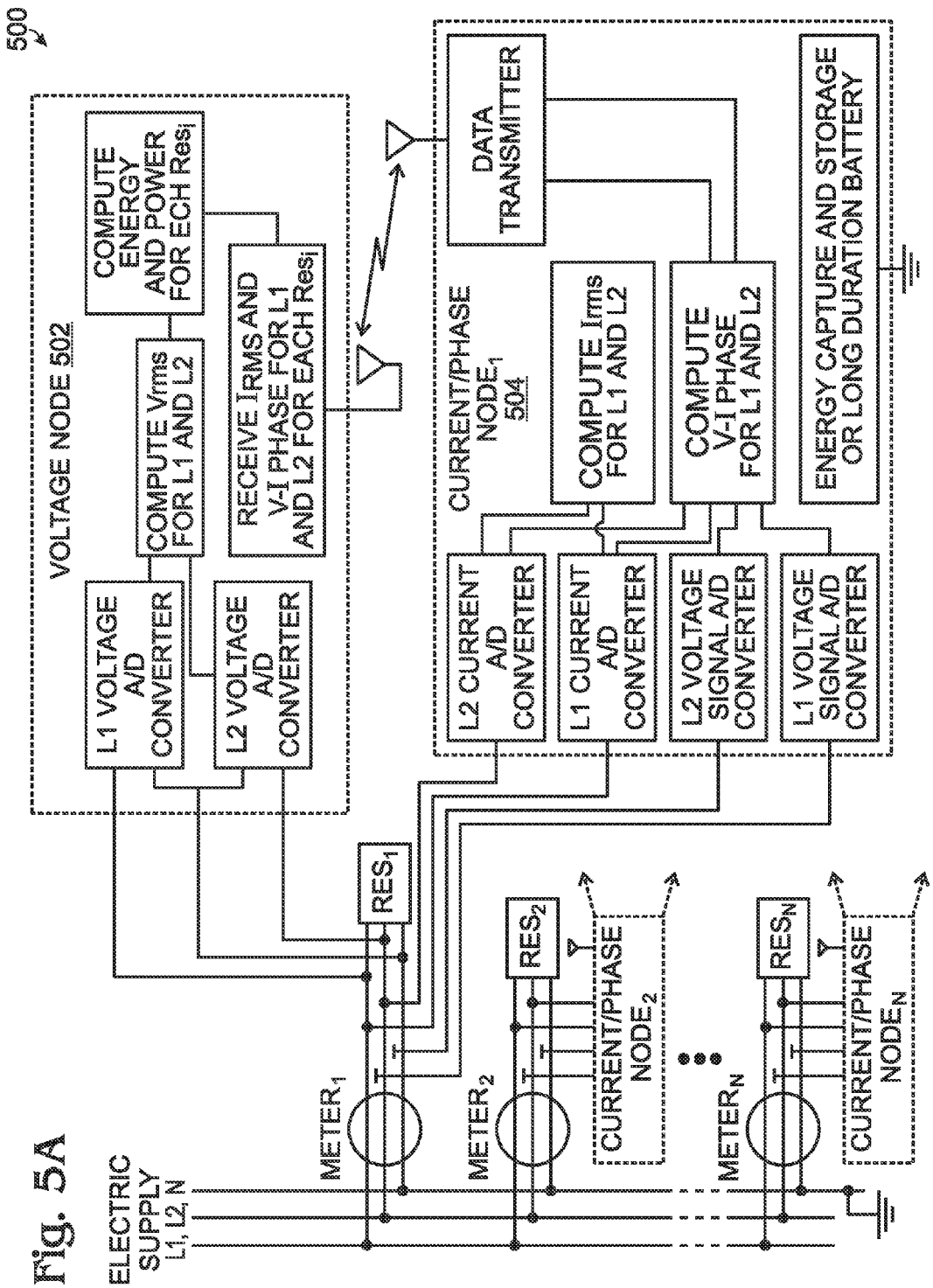
FIGS. 5A and 5B are schematic block diagrams depicting a multi-residence power measurement system.
Figure 5B:
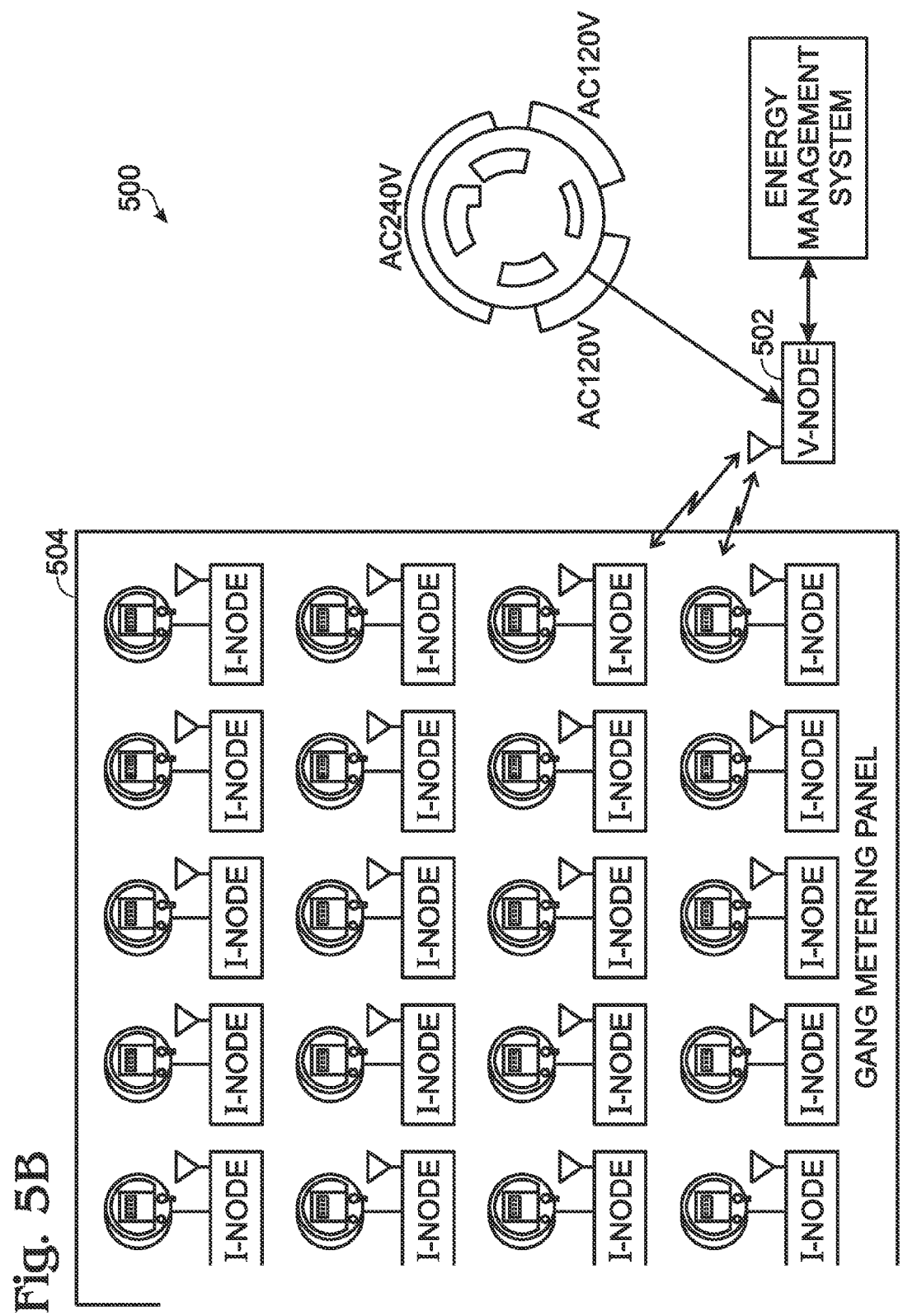

FIGS. 5A and 5B are schematic block diagrams depicting a multi-residence power measurement system. This system 500 measures electrical power using a single voltage measurement node 502 to obtain an accurate reading of the electric supply voltage levels. Current flow measurements are obtained using separate current nodes that obtain current sampled measurements via current transducers (current transformers), or current magnitude and current phase measurements. In one aspect not shown, the RMS voltage for a given period is transmitted to the current node 504 via wireless communications for computing of the power values. Alternatively as shown, current flow and voltage phase measurements are transmitted from the current node 504 to the voltage node 502. At the same current node 504, voltage wave shape measurements are obtained for N residences with non-contact voltage probes, such as electrostatic voltage sensors. In one aspect, the voltage wave shape may be scaled with the voltage level measurement from the voltage node, and voltage samples are multiplied by current samples to obtain the power. In other aspect, power is derived by computing the phase difference between the voltage and the current waves.

The remote current and voltage-shape measuring node 504 may be powered by a long lasting battery or may harvest their power by inductive coupling to the electric conductors of the measured circuit. The voltage node 502 can tap into a breaker panel or into any outlet, preferably close to the electric panel to avoid distortions in voltage measurements during high current flows. Computed values are available to be sent to other systems, such as energy displays and energy management systems.

The number of physical connections for voltage sensing is greatly reduced, thus saving equipment and installation costs. The voltage sensing connections required for accurate voltage metering are only a single set (L1, L2, and Neutral) per metering site. The precision voltage measuring equipment is consolidated into a single device which contains circuitry to make the voltage readings from the single points on L1, L2, and N.

The devices used to make measurements of current and voltage-shape measurements require no physical contact with the electrical conductors. The sensors for current magnitude and phase consist of current transformers which may be "split-core" transformers which are opened and snapped closed around the insulated electrical conductors. The voltage sensors at the measured electric circuit locations do not require absolute magnitude but only the voltage-shape. The voltage-shape measurements are made with electrostatic sensors which, again, do not require a physical connection with the electric conductors. Rather, the voltage phase sensor need only be located near the electric conductor being measured, such as placing the electrostatic voltage sensor on the surface of the insulated electrical conductor.

As the remote current and voltage-shape measuring devices make no direct electrical connection with the circuit being measured, power for the device may be supplied by a local battery. In addition, the device may also harvest power from the electric circuit being tested. When current flows through the electric conductors (current transformer primary winding), the current transformers may extract power from the conductor (at its secondary winding) and store that power in local storage to then power the device. Alternatively, the power may be harvested with separate transformers for that purpose alone. Since there is no guarantee that power will flow through the conductors being measured, the power budget of the current/voltage-shape node may be managed by means such as duty cycle adjustments to maintain communications with the voltage node 502 to match the system requirements (e.g. years of operation on an unused circuit). The current sensing, voltage-shape sensing, and power harvesting pick-ups may be constructed into a single attachment mechanism such that installation around each electrical conductor is simplified.

In normal installations where the voltage magnitude and phase angles of the supply conductors do not vary significantly, only one voltage supply line may be contacted directly by the voltage measuring device. The voltages on the other supply lines may be estimated by the value read from the single sensed line. The voltage phase of the other conductors may be estimated by adding a fixed phase angle to the voltage phase of the sensed conductor. For example, on a 240V, split phase supply with only connections to L1 and N, the voltage on L2 can be assumed to be approximately equal to L1 and the voltage phase of L2 can be estimated to be the voltage phase of L1 plus 180 degrees. This allows the installation of the voltage sensing node to be plugged into a normal 120V AC outlet, thus further simplifying installation (240V outlets being less common).

Similar to the voltage node, the current/voltage-shape nodes do not require the second voltage sensor and acquisition circuitry, as the magnitudes of the voltages are approximately equal and the phase offsets for the two phases are fixed. This reduction in voltage sensing circuitry reduces the hardware costs and the power budget for this device.

The current/voltage-shape node may compute the root-mean-square power values ($P_1$ and $P_2$) for L1 and L2 by multiplying the A/D values captured from the current transformers with the simultaneous A/D samples from the voltage sensor that are by the RMS voltage received from the voltage node. The phase of the voltage signal is not important at the voltage node, but only the RMS value of the voltage A/D readings is computed and transmitted from the voltage node to the current/voltage-shape node.

At the current/voltage-shape node, the A/D converters on the L1 and L2 current inputs provide the current samples, and the electrostatic voltage sensor provides the voltage-shape samples. These voltage-shape samples are multiplied by the scale factor (RMS voltage from the voltage node/RMS value of the voltage-shape samples). Power is computed by multiplying the current samples by the scaled voltage-shape samples. Other values such as power factor and energy consumption can be easily computed.

The measurements of RMS voltage at the single voltage node can be applied to all readings at the current/voltage-shape nodes as the voltage to all the metering locations is same. The voltage loss across the service feeder is negligible due to the very low line resistance of the feeder conductors. This calculated power data may allow for energy usage visualization and personal modification of energy usage. The data is also applicable for automated energy management systems.

The main advantages of this invention over other electric metering techniques are fewer electrical connections are required to gain voltage samples reducing the cost of installation and equipment. In practice, the voltage sample may be obtained from a normal AC plug. The current/voltage-shape node has no electrical connection for extremely easy installation. When power harvesting is used at the current/voltage-shape node, the node has no maintenance requirements (e.g. no battery change). The current/voltage-shape nodes may use one way radio receivers to receive data from the voltage node transmitters. This reduces power consumption and cost at the current/voltage-shape node. Relatively high precision is achieved in the power calculation as a result of multiplying voltage and current samples. Lower precision is achieved using RMS values and phase offset.

Figure 6:
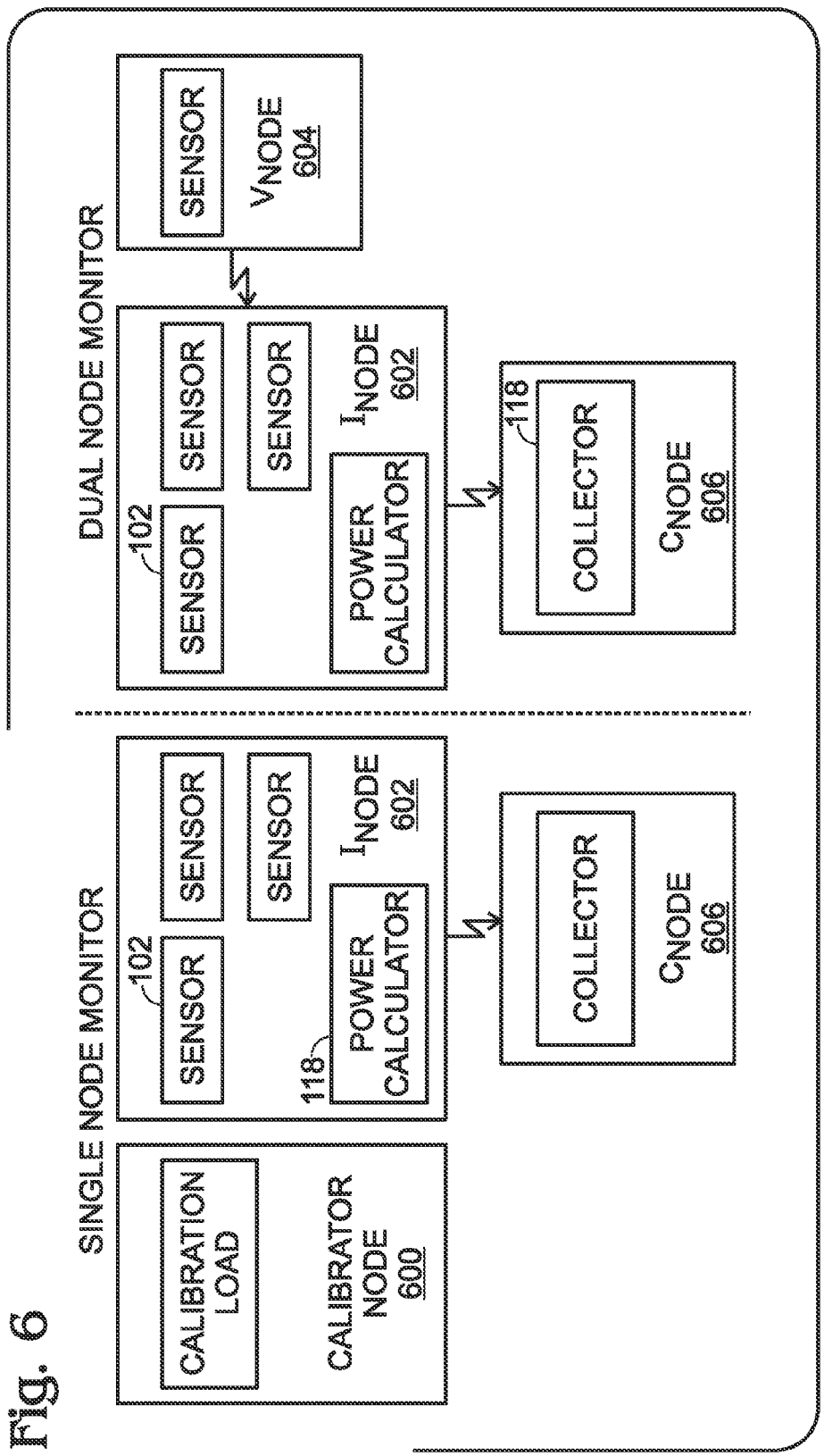
FIG. 6 is a block diagram contrasting a single node system with a two node system.

FIG. 6 is a block diagram contrasting a single node system with a two node system. The bundling of all the sensors in a single node can be distinguished from the distribution of sensors in two nodes. A single node package may be assisted with a calibration load node 600 that does not contain sensors and does not send data, but rather adds known loads in patterns that can be recognized by the sensors and can be used to calibrate the sensors.

The single node packages contain at least a current sensor 102, so it is called the current node 602 (or $I_{node}$). The dual node packages contain a second node that contains at least a contact voltage sensor, so this node is called the voltage node 604 (or $V_{node}$). Both systems use a collector node 606 (or $C_{node}$) to receive data and to send on the power values to a display or a website. As shown, the power calculator 118 is located in the $I_{node}$ 602, but it may alternatively be located in the $C_{node}$ 606 or in the $V_{node}$ 604. Also, while the $V_{node}$ 604 is shown sending data to the $I_{node}$ 602, the system is not limited to this particular signal path.

It is assumed that locations are wired with sufficiently sized wire so that there is a negligible voltage drop between the different circuits for any significant amount of time. If the plug-in node ($V_{node}$) is placed far away from the panel on a circuit that draws large currents, there could be a voltage drop that would distort the voltage measurements. For single residences, a single voltage sensor is generally needed per phase. Most residences use split-phase power and would therefore need two voltage sensors. However, when only one voltage sensor is installed on a first phase of a split-phase supply, the voltage of the second phase may be estimated with reasonable accuracy by using the voltage readings of the first phase.

A single current sensor is needed for each phase for every circuit in the home to be monitored. For example, to monitor a whole house two current sensors would be needed (one for each phase). To separately monitor a 2-phase air conditioner, another two current sensors would be needed. To separately monitor a 2-phase dryer another 2 current sensors would be needed. To separately monitor the living room lights a single current sensor would be needed, and so on. For calculating power in different circuits, a shared voltage value may be used.

Multi-family residences typically share a single transformer between clusters of residences, and all the residences on the same transformer can share a single set of voltage meters. Given the assumption above, a single pair (split-phase) of voltage sensors can provide information needed for power calculations in all residences attached to that transformer. For larger multi-family residences, power may be distributed as 2 phases off of a 3-phase transformer as in 208V WYE distribution. A single set of 3 voltage sensors could then supply the voltage measurements for power calculations in all residences attached to the various phases of the transformer.

Voltage varies little in residential systems, both in amplitude (specified at +−5V in a 120 v system in the US) and shape (very close to a perfect sine wave). However, the phase of the voltage relative to the phase of the current varies substantially.

Measured and estimated voltage parameters can be distinguished. Some conventional power monitors estimate the RMS voltage to be a nominal value and depend only on a current meter to calculate power. An improved power calculation can be made without an actual contact voltage measurement. By combining an estimated voltage value (perhaps entered by a user) with non-contact voltage sensors that have been calibrated (as described below), the power calculation can include the displacement power factor and thereby provide a more accurate estimate of the actual power used.

A single cycle in a 60 Hz system takes 0.0166 seconds. In a 50 Hz system it takes 0.02 seconds. When making computations with current and voltage waveforms, the raw values should not be shifted in time significantly with respect to each other. For example, if the voltage sensor is remote and the voltage value is sent via a connection that adds a 1 ms delay, then the power factor calculation could be off by 7%—this translates into a substantial error in the power calculations. Similarly, a 2 ms delay would induce a 27% error in the power factor calculation. The worst case is where values travel over paths with variable delays, which could introduce delays in a range. If one wireless remote current sensor communicates via a router that introduces a 2 ms delay, the resulting calculation could have an error of 27% or more. Therefore, care must be taken to avoid accidental phase shifts between readings. This may be accomplished by carefully calculating the delays through the various paths, or by timestamping values with accurate time values perhaps with micro-second accuracy.

In one aspect, the voltage waveform shape sensor can be enabled using a simple copper bar taped onto a wire. The sensed voltage shape and phase can be displayed, for example, on an oscilloscope.

Real power can be calculated most accurately by summing the current samples multiplied by the voltage samples over a period of time (e.g. 4096 samples per cycle, 60 cycles per second). If current and voltage samples come from separate meters, the samples are sent to wherever the calculation is being performed. If one of the components (voltage or current) is parameterized, an estimated original waveform can be synthesized from the parameters in order to access the samples.

If RMS values of current and voltage waveforms are used, the "real power" is:

$$I_{rms} \times V_{rms} \times pf$$

Where pf is the power factor that includes contributions from the phase shift between voltage and current and harmonics in the current waveform (the voltage waveform is assumed to be sinusoidal).

Note that the power company bills for "real power", but must deliver complex power (VA) which is calculated as $I_{rms}*V_{rms}$. These values can be very different. Suppose the current is 10 Amps, the voltage is 120 Volts and the power factor is 0.5. The "real power" is 600 Watts, however, the wiring and equipment must be rated for 1,200 VA.

Figure 7:
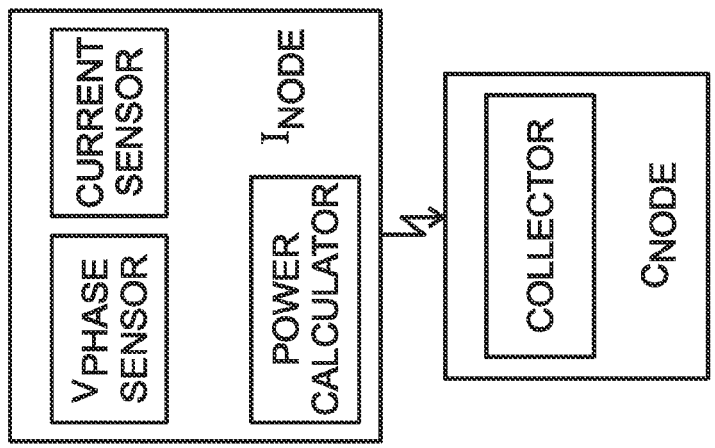
FIG. 7 is a block diagram depicting a power factor compensating system.

FIG. 7 is a block diagram depicting a power factor compensating system. As noted above, one single node system is disclosed herein and referred to as system 1.1 (see FIG. 1), where the numeral "1" following the word "system" signifies a single node system. System 1.1 calculates power as: $I_{rms} \times V_{rms} \times dpf$, using an AC current sensor that may be a current transformer or calibrated magnetometer to measure the current waveform, magnitude, and shape, and a voltage waveform shape sensor to measure $V_{phase}$. A nominal $V_{rms}$ may be estimated. Power measurement distortions may occur as a result of using the nominal $V_{rms}$, and a failure to account for harmonic power factor and displacement power factor. Therefore, the baseline calculation can be enhanced by adding a voltage phase measurement to correct for displacement power factor. The calculation consists of multiplying $I_{rms} \times V_{rms}$, as in the baseline calculation, but this result is then multiplied by cos(angle difference between current and voltage). This system corrects for displacement power factor, but does not correct for harmonic power factor.

The power calculation can be performed in the $I_{node}$ or in the $C_{node}$ (see FIG. 6). If power is calculated at the $C_{node}$, parameters are sent from the $I_{node}$ to the $C_{node}$ and there is no data to synchronize.

As a variation to the above-described system, a voltage phase estimator can be used to create a phase corrected voltage waveform. Again, this system (system 1.2) may be enabled as a single node system. Power is calculated as: sum (I×V). A voltage waveform shape sensor is used to measure $V_{phase}$, and a current transformer or calibrated magnetometer provides waveform, phase, and magnitude data for current. At the $I_{node}$, $V_{phase}$ and nominal $V_{rms}$ are estimated. Power measurement distortions may result from using the nominal $V_{rms}$, and from a failure to account for voltage harmonics. However, compared to system 1.1, distortion due to current harmonics is eliminated.

System 1.2 corrects for displacement power factor and harmonic power factor due to current harmonics. The extra work involved in this system consists of synthesizing the voltage wave form and multiplying the current samples times the voltage samples. This is similar to Schmid (see Background Section above), but the voltage waveform is shifted according to the voltage phase estimator. Unlike Schmid, $V_{rms}$ is not obtained from another meter, but rather from scaling an ideal voltage waveform to a fixed RMS value (e.g., 120V).

The power calculation can be performed in the $I_{node}$ or in the $C_{node}$. If power is calculated at the $C_{node}$, current samples and the phase difference between the voltage and current are sent from the $I_{node}$ to the $C_{node}$ and there is no data to synchronize.

Figure 8:
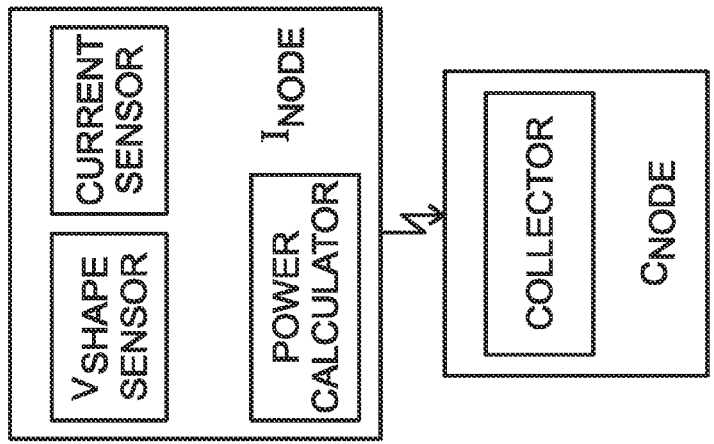
FIG. 8 is a block diagram depicting a voltage waveform shape correcting power measurement system.

FIG. 8 is a block diagram depicting a voltage waveform shape correcting power measurement system. The system depicted in FIG. 8 (system 1.3) provides an assist with a voltage shape estimator to create a shape corrected voltage waveform. Again, the system can be enabled as a single node system, and power is calculated as: sum (I×V). A voltage waveform shape sensor measures $V_{shape}$, and a current transformer or calibrated magnetometer provides current waveform, phase, and magnitude data. In this system the $V_{shape}$ is measured and a nominal $V_{rms}$ value is estimated. Possible power measurement distortions may occur as a result of using the nominal $V_{rms}$, as voltage harmonics may occur in the unsealed waveform.

A voltage waveform shape sensor is used instead of synthesizing the voltage waveform. The voltage waveform shape measurements simply need to be scaled appropriately, because while the non-contact voltage waveform shape sensor gives a good estimate of the waveform shape, the readings are attenuated by the non-contact nature of the signal.

The calculation consists of multiplying the current samples by the scaled voltage samples. This system corrects for voltage waveform distortions. The extra work involved in this system consists of scaling the voltage waveform and multiplying the current samples times the voltage samples. This is similar to Schmid, but the voltage waveform shape is measured, and a perfect voltage sine wave is not assumed.

The power calculation can be performed in the $I_{node}$ or in the $C_{node}$. If power is calculated at the $C_{node}$, current samples and voltage shape samples are sent from the $I_{node}$ to the $C_{node}$ and there is no data to synchronize.

Figure 9:
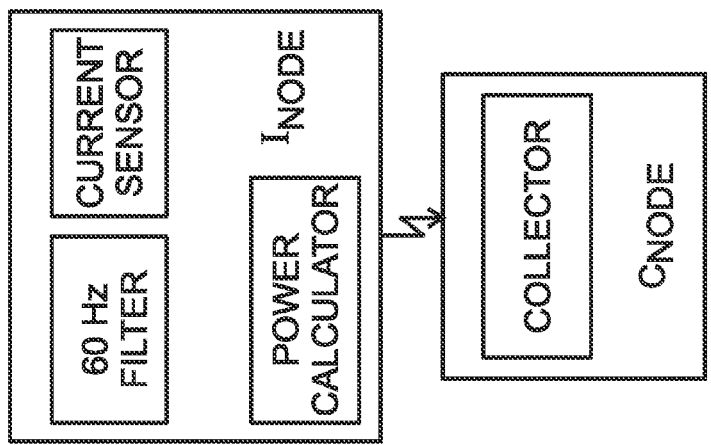
FIG. 9 is a block diagram depicting a power measurement system with harmonic power factor correction.

FIG. 9 is a block diagram depicting a power measurement system with harmonic power factor correction. The system of FIG. 9 (system 1.4) assists in power calculations with the addition of a fundamental frequency filter to add harmonic power factor. Again, the system can be enabled as a single node system. Power is calculated as: $I_{rms} \times V_{rms} \times hpf$. A voltage waveform shape sensor measures $V_{shape}$. A current transformer or calibrated magnetometer provides current waveform, phase, and magnitude data. In this system the $V_{shape}$ is measured and a nominal $V_{rms}$ value is estimated. Possible power measurement distortions may occur as a result of using the nominal $V_{rms}$, and from a failure to account for voltage harmonics and displacement power factor.

A 60 Hz filter (or 50 Hz for international locales) is added to the current sensor output, and the RMS value of this filtered value is computed. This value is divided by the RMS value of the unfiltered samples to obtain the harmonic power factor. The calculation consists multiplying $I_{rms} \times V_{rms}$ as before, and multiplying this result by the harmonic power factor. This system corrects for harmonic power factor, but does not correct for displacement power factor. The power calculation can be performed in the $I_{node}$ or in the $C_{node}$. If power is calculated at the $C_{node}$, parameters are sent from the $I_{node}$ to the $C_{node}$ and there is no data to synchronize.

The system shown in FIG. 9 can also be used to represent system 1.5, a single node that calculates power as follows: $I_{rms} \times V_{rms} \times dpf \times hpf$. A voltage waveform shape sensor measures $V_{shape}$, and a current transformer or calibrated magnetometer provides current waveform, phase, and magnitude data. In this system the $V_{shape}$ is measured and a nominal $V_{rms}$ value is estimated. Possible power measurement distortions may occur as a result of using the nominal $V_{rms}$, and from a failure to account for voltage harmonics.

This system improves the power estimate by taking into account both displacement and harmonic power factors. In theory, this provides identical power values as multiplying current samples by voltage samples, assuming the voltage is a sine wave. The power calculation can be performed in the $I_{node}$ or in the $C_{node}$. If power is calculated at the $C_{node}$, parameters are sent from the $I_{node}$ to the $C_{node}$ and there is no data to synchronize.

System 1.6 replaces the nominal voltage with a calibrated voltage, and can be combined with systems 1.1, 1.2, 1.3, 1.4, or 1.5. System 1.6 can be enabled as a single node system with multiple power calculation modes. A current transformer provides current waveform, phase, and magnitude data. The voltage is estimated by measuring $V_{RMS}$ at the $I_{node}$. Distortions may result from the above-mentioned voltage estimate.

In this system, the current sensor is a pre-calibrated sensor so there is no need to calibrate the current sensor once installed. The calibration node is then used to determine the voltage RMS value. For example, the voltage is computed knowing the resistor (R) values applied at the calibration node and the corresponding current (I) associated with the R. V is computed by: V=I×R.

System 1.7 replaces the nominal voltage with an external voltage, it can be combined with systems 1.1, 1.2, 1.3, 1.4, or 1.5. System 1.7 can be enabled as a single node system with multiple power calculation modes. A current transformer provides current waveform, phase, and magnitude data. The voltage is estimated by measuring $V_{RMS}$ at an external location and sent to $C_{node}$. Distortions may result from the above-mentioned voltage estimate.

The current node meter sends its results to the $C_{node}$. Patel's calibration (see Background Section above) adds circuitry at the $I_{node}$ that detects a calibration pattern introduced by a calibrator plugged into an outlet on the circuit being measured. The calibrator inserts and removes a resistor in a pattern. The single node monitors the current sensor looking for that pattern to determine if the changes in current are due to the calibration routine. If so, then the power node performs extra calculations to determine the voltage based on the current with and without the known resistor.

Patel suggests a calibration pattern of inserting 10 W, 50 W, 100 W, 200 W resistors that are pulsed at 1 Hz. It is believed that this setup is intended for occasional manual calibration, and would be expensive because it needs large resistors to dissipate up to 200 W. More practically, this pattern can be modified with sub-cycle durations so that the measurements are taken at low voltage intervals in the cycle. The calibration can be performed automatically on regular intervals or continuously.

Alternatively, capacitors and/or inductors can be used instead of resistors. This would introduce known values of reactive power based on the inductance (L) and capacitance (C) introduced, so real power would not be wasted (except for circuit inefficiency). Lastly, if an electrostatic voltage shape meter is to be calibrated, the above-mentioned techniques for the calibrating a magnetometer can be applied.

In another aspect, a two node system may be used to measure power. Such a system combines one non-contact node with a contact $V_{node}$. The non-contact node is easy to install because it doesn't need to be wired in. The contact node can be wired in, or can consist of a plug-in package (avoiding the need for an electrician).

As noted above in the Background Section, Schmid describes a possible setup where the $V_{node}$ parameterizes the voltage into $V_{rms}$ and phase, and sends these wirelessly to the $I_{node}$ together with timestamps for synchronization. The $I_{node}$ creates a voltage waveform synthesized from the received info, and then multiplies the samples together. This technique requires that the nodes be time-synchronized.

The voltage waveform lends itself to being parameterized because it is typically very close to a perfect sine wave (although its phase, frequency, and amplitude vary). In contrast, the current typically suffers from harmonics, so it is more difficult to parameterize.

System 2.1 uses a voltage phase estimator to assist with displacement power factor corrections. The numeral "2" following the word "system" signifies a multi-node system This system is the same as system 1.1 for the single node monitor, except that the $V_{rms}$ is updated by communications means regularly from the contact $V_{node}$.

The power calculation can be performed in the $I_{node}$, the $V_{node}$, or in the $C_{node}$. If power is calculated at the $V_{node}$, parameters are sent from the $I_{node}$ to the $V_{node}$ and there is no data to synchronize. If power is calculated at the $C_{node}$, parameters are sent from the sensor nodes with no synchronization needed.

System 2.2 is the same as system 1.2 for the single node monitor, except that the $V_{rms}$ is updated by a communications means, regularly from the contact $V_{node}$. System 2.2 uses a voltage phase estimator to create a phase corrected voltage waveform. The power calculation can be performed in the $I_{node}$, the $V_{node}$, or in the $C_{node}$. If power is calculated at the $V_{node}$, current samples and the phase difference from the $I_{node}$ to the $V_{node}$ are sent, and the phase difference is used to synchronize the samples. If power is calculated at the $C_{node}$, current samples, the phase difference from the $I_{node}$, to the $C_{node}$, and the $V_{node}$ voltage samples are sent to the $C_{node}$. The phase difference is used to synchronize the samples.

System 2.3 is the same as system 1.3 for the single node monitor, except that the $V_{rms}$ is updated regularly by a communications means from the contact $V_{node}$. System 2.3 uses a voltage shape estimator to create a shape corrected voltage waveform. The power calculation can be performed in the $I_{node}$, the $V_{node}$, or in the $C_{node}$. If calculated at the $V_{node}$, current samples and the voltage shape samples from the $I_{node}$ are sent to the $V_{node}$ and the phase difference are used to synchronize the samples. If power is calculated at the $C_{node}$, current samples, the phase difference from the $I_{node}$ to the $C_{node}$, and $V_{node}$ voltage samples are sent to the $C_{node}$. The phase difference is used to synchronize the samples.

System 2.4 is the same as system 1.4 for the single node monitor, except that the $V_{rms}$ is updated regularly by a communications means from the contact $V_{node}$. System 2.4 uses a fundamental frequency filter to correct for the harmonic power factor.

System 2.5 combines systems 2.1 and 2.4, and is the same as the system 1.5 for the single node monitor, except that the $V_{rms}$ is updated regularly by a communications means from the contact $V_{node}$.

System 2.6 replaces time-synchronization with time-lags. If the time delay introduced by sending the data between nodes is known, then synchronized systems are not required. This system eliminates the complexity of synchronizing clocks between the nodes. Instead, the voltage phase arrives at the non-contact node with a time-lag parameter. Even if the node clocks drift, the difference in the time lag measurement is insignificant. This system also does not require any new voltage sensors. The timing reference between the sender and the receiver may be a transmitted data packet (e.g., synchronized on the packet's preamble). The sending node transmits the delay from its local data measurements to the synchronizing transmission point (preamble) and the receiving node measures the delay from the synchronizing reception point (preamble) to the locally measured data.

System 2.7 is the same as system 2.2, except that the instead of synthesizing a voltage wave form, samples are used from the $V_{node}$. System 2.7 uses a voltage phase estimator to create a phase corrected voltage waveform.

The power calculation can be performed in the $I_{node}$, the $V_{node}$, or in the $C_{node}$. If power is calculated at the $I_{node}$, voltage samples are sent from the $V_{node}$ to the $I_{node}$ and the samples are synchronized by adjusting the Vnode samples by the phase difference. If power is calculated at the $V_{node}$, current samples and the phase difference from the $I_{node}$ are sent to the $V_{node}$ and the phase difference is used to synchronize the samples. If power is calculated at the $C_{node}$, current samples, the phase difference from the $I_{node}$ to the $C_{node}$, and the $V_{node}$ voltage samples are sent to the $C_{node}$. The phase difference is used to synchronize the samples.

In most of these variations presented above, power can be calculated at any node simply by sending information between nodes. Thus, there is no reason to perform the calculations in the $I_{node}$. Especially in a multi-family site where there may be 50 $I_{nodes}$ (that may use batteries), the complexity and power demands of the $I_{nodes}$ should optimally be reduced. Thus, the current parameters can be sent to either the $V_{node}$ or to the $C_{node}$ for processing For dual node variations that send parameterized values, the delay introduced by sending the parameters (instead of measuring them locally) is insignificant. On the other hand, variations that multiply samples must be carefully synchronized by either synchronizing the node clocks and timestamping the samples being sent, or by tracking the time-lag introduced by the transmission. Table 1 summarizes the system requiring synchronization.

TABLE 1

| Variation | Power Calculation | Bandwidth | Synchronization needed |
|---|---|---|---|
| Single node | Sum(I × V) | High bandwidth | No |
| Single node | Product of Parameters | Low bandwidth | No |
| Dual node | Sum(I × V) | High bandwidth | Yes (or measure phase difference) |
| Dual node | Product of Parameters | Low bandwidth | No |

For variations using parameterized values. Wi-Fi or a simple form of Power Line Communications (PLC) may be used. For variations that multiply samples, either synchronization (clock or time-lags), or measuring the phase difference can be used to shift the samples appropriately.

Power for the non-contact nodes may be most easily supplied with replaceable batteries with a long service life. However, batteries do present a maintenance issue, especially when there are many current measuring nodes, measuring a multitude of apartments and/or sub-circuits. When current transformers are used to measure the current flows, there is available power from those same transformers. The current transformers may provide the dual function of providing current measurements and power for the node. Separate transformers are also possible for each function; power and measurement.

Power can only be harvested from the measured circuit when there is a current flow in that circuit. If the circuit has inadequate power flow to keep the current measurement node supplied with power, then the $I_{node}$ must adjust its duty cycle to match the available power or be augmented with an additional power source (e.g., batteries).

Figure 10:
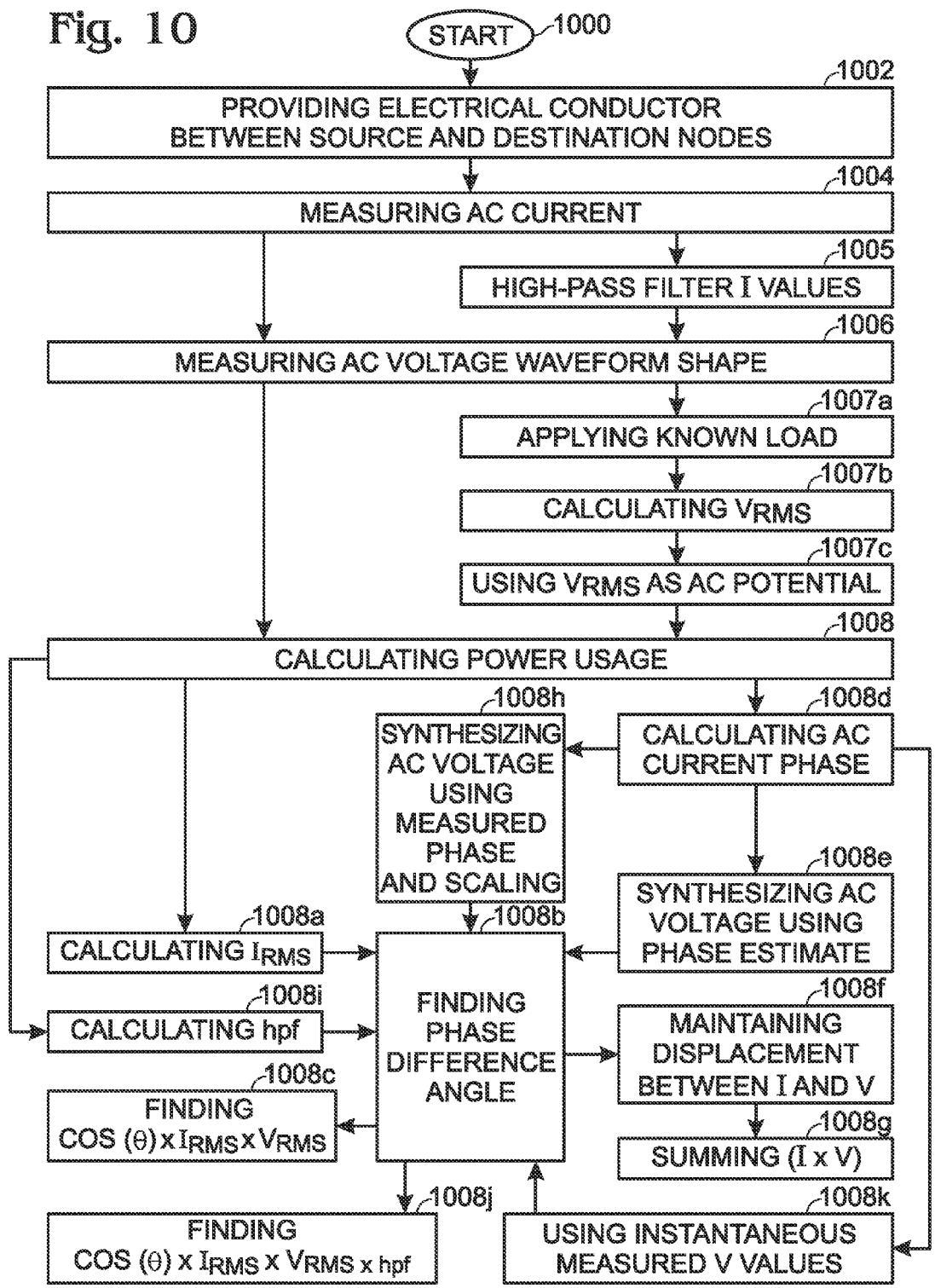
FIG. 10 is a flowchart illustrating a method for calculating power using a voltage waveform shape measurement from a contactless sensor.

FIG. 10 is a flowchart illustrating a method for calculating power using a voltage waveform shape measurement from a contactless sensor. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 1000.

Step 1002 provides an electrically conductive medium carrying AC electrical current, associated with an AC voltage, from a source node to a destination node. Step 1004 measures the AC current through the electrically conductive medium. Step 1006, using a contactless sensor not directly connected to the electrically conductive medium, measures an AC voltage waveform shape. Step 1008 calculates power usage at the destination node in response to the AC current measurement, the measurement of the AC voltage waveform shape, and an AC voltage potential.

In one aspect, measuring the AC current in Step 1004 includes measuring the AC current at a first node located between the source node and the destination node, and measuring the AC voltage waveform shape in Step 1006 also includes measuring the AC voltage waveform shape at the first node. Calculating the power usage in Step 1008 includes calculating the power usage in response to the AC voltage potential that is an AC voltage potential estimate, an actual measurement of the AC voltage potential, or a value supplied by an external source.

In one aspect, measuring the AC current in Step 1004 includes measuring a plurality of instantaneous current values (I) each AC cycle. Measuring the AC voltage waveform shape in Step 1006 includes measuring AC voltage phase. Calculating power usage in Step 1008 includes the following substeps. Step 1008a calculates AC current phase and an AC current root mean square ($I_{RMS}$) value from the plurality of I values. Step 1008b finds a difference angle (θ) between the phase of the AC current and the phase of the AC voltage. Step 1008c, using a $V_{RMS}$ value derived from the AC voltage potential, finds cos (θ)×$I_{RMS}$×$V_{RMS}$.

In a related variation. Step 1008d calculates AC current phase from the plurality of I values. Step 1008e creates a synthesized AC voltage signal with a plurality of instantaneous voltage values (V) each cycle, by scaling an AC voltage magnitude by an estimate of the AC voltage waveform shape having the same phase as the measured AC voltage waveform. Step 1008b finds the difference angle (θ) between the phase of the AC current and the phase of the AC voltage. Step 1008f uses the difference angle to maintain displacement between the I and V instantaneous values. Step 1008g sums (I×V) over a plurality of values.

In another aspect, Step 1004 measures a plurality of instantaneous current values (I) each AC cycle. Step 1008d calculates AC current phase from the plurality of I values. Step 1008h creates a synthesized AC voltage signal with a plurality of instantaneous voltage values (V) each cycle, by scaling an AC voltage magnitude by the measured AC voltage waveform shape. Step 1008b finds the difference angle (θ) between the phase of the AC current and the phase of the AC voltage. Step 1008f uses the difference angle to maintain displacement between the I and V instantaneous values. Step 1008g sums (I×V) over a plurality of values.

In another aspect, Step 1004 measures a plurality of instantaneous current values (I) each AC cycle. Step 1005 high-pass filters the plurality of measured I values. Step 1008i calculates a harmonic distortion power factor (hpf) from the I values and filtered I values. Step 1008b finds a difference angle (θ) between the phase of the AC current and the phase of the AC voltage. Step 1008j, using a $V_{RMS}$ value derived from the AC voltage potential, finds cos (θ)×$I_{RMS}$×$V_{RMS}$×hpf.

In another aspect, Step 1004 measures a plurality of instantaneous current values (I) each AC cycle. Step 1008d calculates AC current phase from the plurality of I values. Step 1008k uses a plurality of measured instantaneous voltage values (V) each cycle. Step 1008b finds the difference angle (θ) between the phase of the AC current and the phase of the AC voltage. Step 1008f uses the difference angle to maintain displacement between the I and V instantaneous values. Step 1008g sums (I×V) over a plurality of values.

In an another variation, Step 1007a applies a known load to a second node connected to the electrically conductive medium. Step 1007b, in response to measuring the AC current across the known load, calculates $V_{RMS}$. Step 1007c uses $V_{RMS}$ as the AC voltage potential in calculating power usage. In one aspect, Step 1007a applies the known load for sub-cycle durations. In another aspect, Step 1007a applies the known load that may be a resistor, capacitor, inductor, or a combination of the above-mentioned elements.

Figure 11:
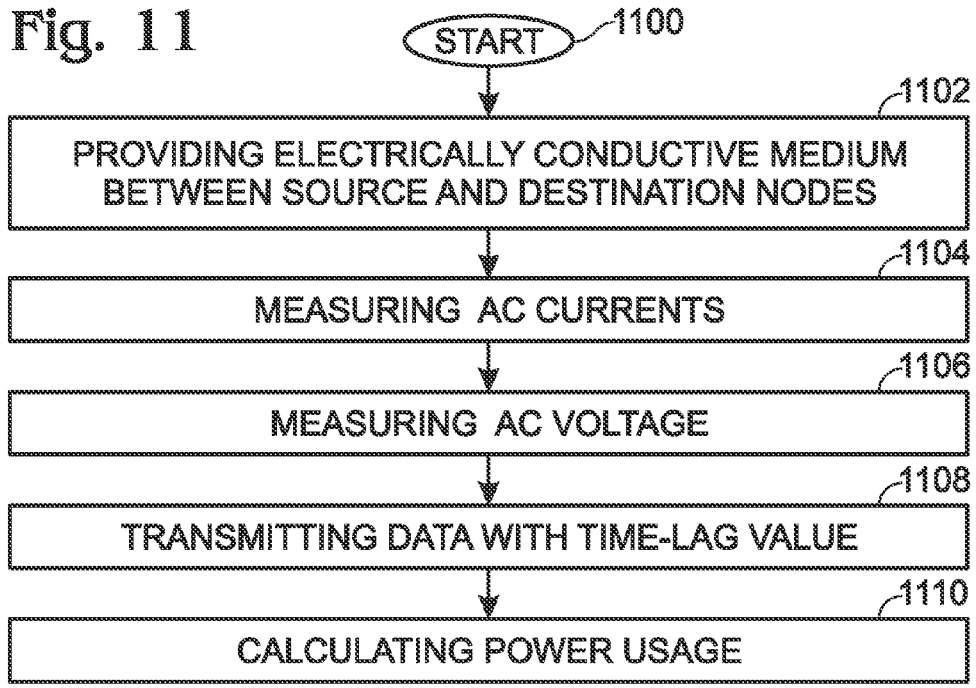
FIG. 11 is a flowchart illustrating a variation of the method for calculating power using information measured at different nodes.
Figure 12:
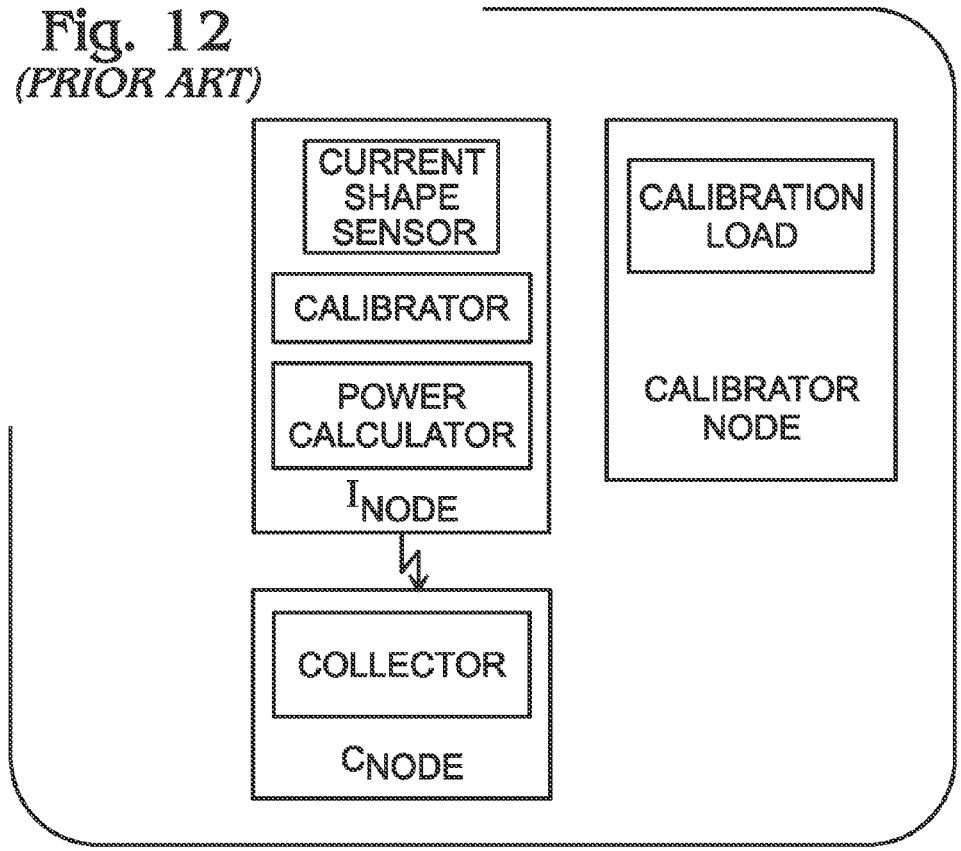
FIG. 12 is a block diagram depicting a first power measurement system (prior art).
Figure 13:
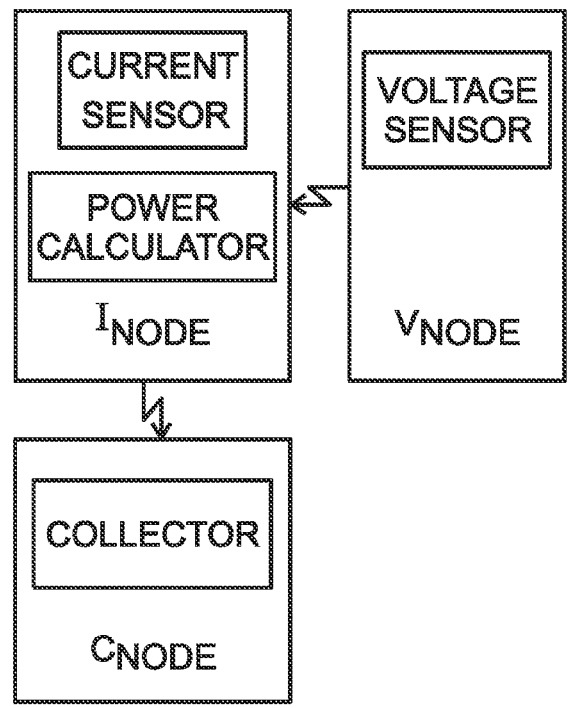
FIG. 13 is a block diagram depicting a second power measurement system (prior art).
Figure 14:
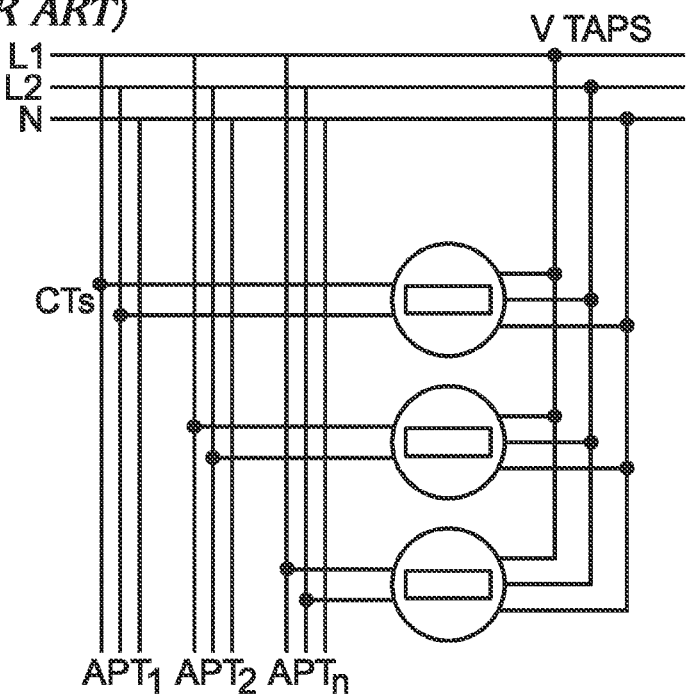
FIG. 14 is a drawing depicting a multi-family metering system (prior art).

FIG. 11 is a flowchart illustrating a variations in the method for calculating power using information measured at different nodes. The method begins at Step 1100. Step 1102 provides an electrically conductive medium carrying AC electrical current, associated with an AC voltage, from a source node to a destination node. Step 1104 measures the AC current through the electrically conductive medium at a first node. Step 1106 measures the AC voltage on the electrically conductive medium at a second node. Step 1108 transmits measurement data from a test node to the first node, the second node, or both the first and second nodes. The transmitted measurement data includes a measured time-lag value, where the time-lag value is a duration of time between when data is measured, and when the data is transmitted. Step 1110 calculates power usage in response to the AC current measurement, the AC voltage measurement, and the time-lag value. In one aspect, Step 1108 transmits data to the first node, the second node, or a collection node.

A system and method have been provided for making power measurements using a contactless voltage waveform shape sensor. Examples of particular message structures and hardware units have been presented to illustrate the invention. However, the invention is not limited to merely these examples. Other variations and embodiments of the invention will occur to those skilled in the art.

We claim:

1. A method for calculating power using a voltage waveform shape measurement from a contactless sensor, the method comprising:
    providing an electrically conductive medium carrying alternating electrical current (AC), associated with an AC voltage, from a source node to a destination node;
    measuring the AC current through the electrically conductive medium;
    using a contactless sensor not directly connected to the electrically conductive medium, measuring an AC voltage waveform shape; and,
    using a calculator, calculating power usage at the destination node in response to the AC current measurement, the measurement of the AC voltage waveform shape, and an AC voltage potential.

2. The method of claim 1 wherein measuring the AC current includes measuring the AC current at a first node located between the source node and the destination node;
    wherein measuring the AC voltage waveform shape includes measuring the AC voltage waveform shape at the first node; and,
    wherein calculating the power usage includes calculating the power usage in response to the AC voltage potential selected from a group consisting of an AC voltage potential estimate, an actual measurement of the AC voltage potential, and a value supplied by an external source.

3. The method of claim 2 wherein measuring the AC current includes measuring a plurality of instantaneous current values (I) each AC cycle;
    wherein measuring the AC voltage waveform shape includes measuring AC voltage phase;
    wherein calculating power usage includes:
        calculating AC current phase and an AC current root mean square ($I_{RMS}$) value from the plurality of I values;
        finding a difference angle ($\theta$) between the phase of the AC current and the phase of the AC voltage; and,
        using a $V_{RMS}$ value derived from the AC voltage potential, finding $\cos(\theta) \times I_{RMS} \times V_{RMS}$.

4. The method of claim 2 wherein measuring the AC current includes measuring a plurality of instantaneous current values (I) each AC cycle;
    wherein measuring the AC voltage waveform shape includes measuring AC voltage phase;
    wherein calculating power usage includes:
        calculating AC current phase from the plurality of I values;
        creating a synthesized AC voltage signal with a plurality of instantaneous voltage values (V) each cycle, by scaling an AC voltage magnitude by an estimate of the AC voltage waveform shape having the same phase as the measured AC voltage waveform;
        finding a difference angle ($\theta$) between the phase of the AC current and the phase of the AC voltage;
        using the difference angle to maintain displacement between the I and V instantaneous values; and,
        summing ($I \times V$) over a plurality of values.

5. The method of claim 2 wherein measuring the AC current includes measuring a plurality of instantaneous current values (I) each AC cycle;
    wherein calculating power usage includes:
        calculating AC current phase from the plurality of I values;
        creating a synthesized AC voltage signal with a plurality of instantaneous voltage values (V) each cycle, by scaling an AC voltage magnitude by the measured AC voltage waveform shape; and,
        finding a difference angle ($\theta$) between the phase of the AC current and the phase of the AC voltage;
        using the difference angle to maintain displacement between the 1 and V instantaneous values; and,
        summing ($I \times V$) over a plurality of values.

6. The method of claim 2 wherein measuring the AC current includes measuring a plurality of instantaneous current values (I) each AC cycle;
    the method further comprising:
    high-pass filtering the plurality of measured 1 values;
    wherein calculating power usage includes:
        calculating a harmonic distortion power factor (hpf) from the I values and filtered I values;
        finding a difference angle ($\theta$) between the phase of the AC current and the phase of the AC voltage; and,
        using a $V_{RMS}$ value derived from the AC voltage potential, finding $\cos(\theta) \times I_{RMS} \times V_{RMS} \times hpf$.

7. The method of claim 2 further comprising:
    applying a known load to a second node connected to the electrically conductive medium;
    in response to measuring the AC current across the known load, calculating $V_{RMS}$; and,
    using $V_{RMS}$ as the AC voltage potential in calculating power usage.

8. The method of claim 7 wherein applying the known load to the second node includes applying the known load for sub-cycle durations.

9. The method of claim 7 wherein applying the known load to the second node includes applying the known load selected from a group consisting of a resistor, a capacitor, and an inductor.

10. The method of claim 2 wherein measuring the AC current includes measuring a plurality of instantaneous current values (I) each AC cycle;
    wherein calculating power usage includes:
        calculating AC current phase from the plurality of I values;
        using a plurality of measured instantaneous voltage values (V) each cycle;

finding a difference angle (θ) between the phase of the AC current and the phase of the AC voltage;
using the difference angle to maintain displacement between the I and V instantaneous values; and,
summing (I×V) over a plurality of values.

11. A method for calculating power using information measured at different nodes, the method comprising:
providing an electrically conductive medium carrying alternating electrical current (AC), associated with an AC, voltage, from a source node to a destination node;
measuring the AC current through the electrically conductive medium at a first node;
measuring the AC voltage on the electrically conductive medium at a second node;
transmitting measurement data from a test node selected from a group consisting of the first node, the second node, and both the first and second nodes, the transmitted measurement data including a measured time-lag value, where the time-lag value is a duration of time between when data is measured, and when the data is transmitted; and,
using a calculator, calculating power usage in response to the AC current measurement, the AC voltage measurement, and the time-lag value.

12. The method of claim 11 wherein transmitting data includes transmitting data to a node selected from a group consisting of the first node, the second node, and a collection node.

13. A system for calculating power using a contactless voltage phase sensor, the system comprising:
a contactless alternating electrical current (AC) sensor configured to couple to a first node of an electrically conductive medium carrying AC current, associated with an AC voltage, from a source node to a destination node, the contactless AC current sensor having an output for supplying an AC current measurement;
a contactless voltage phase sensor configured to couple to the first node without directing connecting to the electrically conductive medium, and having an output for supplying an AC waveform shape measurement; and,
a calculator having an input port the accept the AC current measurement and the AC waveform shape measurement, the calculator having an output to supply a power usage value for the destination node in response to the AC current measurement, the AC voltage waveform shape measurement, and an AC voltage potential.

14. The system of claim 13 wherein the calculator calculates the power usage in response to the AC voltage potential selected from a group consisting of an AC voltage potential estimate, an actual measurement of the AC voltage potential, and a value supplied by an external source.

15. The system of claim 14 wherein the AC current sensor supplies a plurality of instantaneous current values (I) each AC cycle;
wherein the voltage phase sensor supplies an AC voltage phase measurement; and,
wherein the calculator calculates AC current phase and a AC current root mean square (Liras) value from the plurality of I values, finds a difference angle (θ) between the phase of the AC current and the phase of the AC voltage, and uses a $V_{RMS}$ value derived from the AC voltage potential to find $\cos(\theta) \times I_{RMS} \times V_{RMS}$.

16. The system of claim 14 wherein the AC current sensor supplies a plurality of instantaneous current values (I) each AC cycle;
wherein the voltage phase sensor supplies an AC voltage phase measurement; and,
wherein the calculator calculates AC current phase from the plurality of I values and creates a synthesized AC voltage signal with a plurality of instantaneous voltage values (V) each cycle, by scaling an AC voltage magnitude by an estimate of the AC voltage waveform shape having the same phase as the AC voltage phase measurement, the calculator finding a difference angle (θ) between the phase of the AC current and the phase of the AC voltage, using the difference angle to maintain displacement between the I and V instantaneous values, and summing (I×V) over a plurality of values.

17. The system of claim 14 wherein the AC current sensor supplies a plurality of instantaneous current values (I) each AC cycle; and,
wherein the calculator calculates AC current phase from the plurality of I values and creates a synthesized AC voltage signal with a plurality of instantaneous voltage values (V) each cycle, by scaling an AC voltage magnitude by the measured AC voltage waveform shape, the calculator finding a difference angle (θ) between the phase of the AC current and the phase of the AC voltage, using the difference angle to maintain displacement between the I and V instantaneous values, and summing (I×V) over a plurality of values.

18. The system of claim 14 wherein the AC current sensor includes a high-pass filter and supplies a plurality of instantaneous current values (I) each AC cycle with a plurality of high-pass filtered I values;
wherein the voltage phase sensor supplies an AC voltage phase measurement; and,
wherein the calculator calculates AC current phase from the plurality of 1 values and calculates a harmonic distortion power factor (hpf) from the I values an I filtered 1 values, the calculator finding a difference angle (θ) between the phase of the AC current and the phase of the AC voltage, and using a $V_{RMS}$ value derived from the AC voltage potential, to find $\cos(\theta) \times I_{RMS} \times V_{RMS} \times hpf$.

19. The system of claim 14 further comprising;
a known load configured to selectively connect to a second node of the electrically conductive medium;
wherein the AC current sensor supplies a calibrated AC current measurement when the known load is connected; and,
wherein the calculator calculates a $V_{RMS}$ value in response to the known load and calibrated AC current measurement, and uses the $V_{RMS}$ value as the AC voltage potential in calculating power usage.

20. The system of claim 19 wherein the known load is selectively connected to the second node for sub-cycle durations.

21. The system of claim 19 wherein the known load is selected from a group consisting of a resistor, a capacitor, and an inductor.

22. The system of claim 14 wherein the AC current sensor supplies a plurality of instantaneous current values (I) each AC cycle; and,
wherein the calculator accepts a plurality of measured instantaneous voltage values (V) each cycle from the external source, the calculator calculating AC current phase in response to the plurality of I values, finding a difference angle (θ) between the phase of the AC current and the phase of the AC voltage, using the difference angle to maintain displacement between the I and V instantaneous values, and summing (I×V) over a plurality of values.

23. A system for calculating power using information measured at different nodes, the system comprising:

an alternating electrical current (AC) sensor configured to couple to a first node of an electrically conductive medium carrying AC current, associated with an AC voltage, from a source node to a destination node, the AC current sensor having an output for supplying AC current measurement data;

an AC voltage sensor configured to couple to a second node, and having an output for supplying AC voltage measurement data;

wherein a test node selected from a group consisting of the first node, the second node, or both the first and second nodes, transmits measurement data including a measured time-lag value, where the time-lag value is a duration of time between when data is measured, and when the data is transmitted; and, the system further comprising:

a calculator having an input to accept the AC current measurement data, the AC voltage measurement data, and the time lag values, an output to supply destination node power usage data in response to the inputs.

24. The system of claim 23 wherein the calculator is located at a node selected from a group consisting of the first node, the second test node, and a third node.

* * * * *